United States Patent
Snaith

(10) Patent No.: US 9,349,971 B2
(45) Date of Patent: May 24, 2016

(54) SOLID STATE HETEROJUNCTION DEVICE

(75) Inventor: Henry J. Snaith, Abingdon (GB)

(73) Assignee: Isis Innovation Limited, Oxford (GB)

( * ) Notice: Subject to any disclaimer, the term of this patent is extended or adjusted under 35 U.S.C. 154(b) by 1202 days.

(21) Appl. No.: 13/377,081

(22) PCT Filed: Jun. 8, 2010

(86) PCT No.: PCT/GB2010/001117
§ 371 (c)(1),
(2), (4) Date: Feb. 28, 2012

(87) PCT Pub. No.: WO2010/142947
PCT Pub. Date: Dec. 16, 2010

(65) Prior Publication Data
US 2012/0146007 A1 Jun. 14, 2012

(30) Foreign Application Priority Data
Jun. 8, 2009 (GB) .................... 0909818.7

(51) Int. Cl.
*H01L 51/46* (2006.01)
*H01L 51/48* (2006.01)
*H01L 51/42* (2006.01)
*H01L 51/00* (2006.01)

(52) U.S. Cl.
CPC .......... *H01L 51/422* (2013.01); *H01L 51/4266* (2013.01); *H01L 51/006* (2013.01); *H01L 2251/306* (2013.01); *Y02E 10/549* (2013.01); *Y02P 70/521* (2015.11)

(58) Field of Classification Search
None
See application file for complete search history.

(56) References Cited

U.S. PATENT DOCUMENTS

| 2008/0092946 A1* | 4/2008 | Munteanu et al. ............ 136/252 |
| 2009/0020149 A1 | 1/2009 | Woods et al. |
| 2010/0006148 A1* | 1/2010 | Zheng et al. .................. 136/256 |
| 2010/0282309 A1* | 11/2010 | Pschirer et al. ............... 136/255 |
| 2011/0300338 A1* | 12/2011 | Shin et al. ..................... 428/156 |

FOREIGN PATENT DOCUMENTS

| EP | 1176646 A1 | 1/2002 |
| EP | 1837929 A1 | 9/2007 |
| WO | 2008098797 A2 | 8/2008 |

OTHER PUBLICATIONS

Soga, Nanostructured Materials for Solar Energy Conversion (2006), p. 262.*
Tennakone et al., "A Dye-sensitized Nano-porus Solid-state Photovoltaic Cell" Semicond. Sci. Technol. 10:1689-93 (1995).

(Continued)

*Primary Examiner* — Ling Choi
*Assistant Examiner* — Catherine S Branch
(74) *Attorney, Agent, or Firm* — Jeffrey N. Townes; LeClairRyan

(57) ABSTRACT

The present invention provides a solid-state p-n heterojunction comprising a p-type material in contact with an n-type material wherein said n-type material comprises $SnO_2$ having at least one surface-coating of a surface coating material having a higher band-gap than $SnO_2$ and/or a conduction band edge closer to vacuum level than $SnO_2$, such as MgO. The invention also provides optoelectronic devices such as solar cells or photo sensors comprising such a p-n heterojunction, and methods for the manufacture of such a heterojunction or device.

34 Claims, 7 Drawing Sheets

Schematic diagram of a solid state dye sensitised solar cell formed with a mesoporous $SnO_2$ n-type semiconductor material.

(56) References Cited

OTHER PUBLICATIONS

Bach et al., "Solid-State Dye-Sensitized Mesoporus TiO2 Solar Cells with High Photon-to-Electron Conversion Efficiencies" Nature 395(8):583-85 (1998).
Bedja et al., "Photosensitization of Composite Metal Oxide Semiconductor Films" Ber. Bunsenges. Phys. Chem. 101 (11):1651-53 (1997).
Fabregat-Santiago et al., "Electron Transport and Recombination in Solid-State Dye Solar Cell with Spiro-OMeTAD as Hole Conductor" J. Am. Chem. Soc. 131:558-62 (2009).
Green et al., "Charge Transport Versus Recombination in Dye-Sensitized Solar Cells Employing Nanocrystalline TiO2 and SnO2 Films" J. Phys. Chem. B 109:12525-33 (2005).
Grätzel, "Photoelectrochemical Cells" Nature 414:338-44 (2001).
Grinis el al., "Collector-Shell Mesoporous Electrodes for Dye Sensitized Solar Cells" Isr. J. Chem. 48:269-75 (2008).
Horiuchi et al., "High Efficiency of Dye-Sensitized Solar Cells Based on Metal-Free Indoline Dyes" J. Am. Chem. Soc. 126:12218-19 (2004).
Howie et al., "Characterization of Solid-State Dye-Sensitized Solar Cells Utilizing High Absorption Coefficient Metal-Free Organic Dyes" J. Am. Chem. Soc. 130:1367-75 (2008).
Kay et al., "Dye-Sensitized Core-Shell Nanocrystals: Improved Efficiency of Mesoporous Tin Oxide Electrodes Coated with a Thin Layer of an Insulating Oxide" Chem. Mater. 14(7): 2930-35 (2002).
Kuang et al., "Ion Coordinating Sensitizer for High Efficiency Mesoscopic Dye-Sensitized Solar Cells: Influence of Lithium Ions on the Photovoltaic Performance of Liquid and Solid-State Cells" Nano Lett. 6(4):769-73 (2006).
Kuang et al., "A New Ion-Coordinating Ruthenium Sensitizer for Mesoscopic Dye-Sensitized Solar Cells" Inorganica Chimica Acta 361:699-706 (2008).
Kumara et al., "Dye-Sensitized Solar Cell with the Hole Collector p-CuSCN Deposited from a Solution in n-propyl Sulphide" Sol. Energ. Mat. Sol. C. 69:195-99 (2001).
Palomares et al., "Kinetic Redundancy in Dye Sensitised Solar Cells: The Use of High Band Gap Metal Oxide Barrier Layers" Proc. of SPIE 5520:76-81 (2004).
Perera et al., "The Effect of MgO on the Enhancement of the Efficiency in Solid-State Dye Sensitized Photocells Fabricated with SnO2 and CuI" Bull. Chem. Soc. Jpn. 76:659-62 (2003).
Reddy et al., "Efficient Sensitization of Nanocrystalline TiO2 Films by a Near-IR-Absorbing Unsymmetrical Zinc Phthalocyanine" Agnew. Chem. Int. Ed. 46:373-76 (2007).
Sirimanne et al., "Progress in Dye-Sensitized Solid State Solar Cells" Phys. Stat. Sol. (b) 245(9):1828-33 (2008).
Snaith et al., "Ion-Coordinating Sensitizer in Solid-State Hybrid Solar Cells" Agnew. Chem. Int. Ed. 44:6413-17 (2005).
Snaith et al., "Enhanced Charge Mobility in a Molecular Hole Transporter via Addition of Redox Inactive Ionic Dopant: Implication to Dye-Sensitized Solar Cells" Appl. Phys. Lett. 89:262114 (2006).
Snaith et al., "Advances in Liquid-Electrolyte and Solid-State Dye-Sensitized Solar Cells" Adv. Mat. 19:3187-3200 (2007).
Snaith et al., "Efficiency Enhancements in Solid-State Hybrid Solar Cells via Reduced Charge Recombination and Increased Light Capture" Nano Lett. 7(11):3372-76 (2007).
Snaith et al., "Electron and Hole Transport through Mesoporous TiO2 Infiltrated with Spiro-MeOTAD" Adv. Mater. 19:3643-47 (2007).
Snaith et al., "Light-Enhanced Charge Mobility in a Molecular Hole Transporter" Phys. Rev. Lett. 98:177402 (2007).
Snaith et al., "Charge Collection and Pore Filling in Solid-State Dye-Sensitized Solar Cells" Nanotechnology 19:424003 (2008).
Snaith et al., "High Extinction Coefficient 'Antenna' Dye in Solid-State Dye-Sensitized Solar Cells: A Photophysical and Electronic Study" J. Phys. Chem. C 112(20): 7562-66 (2008).
Snaith et al., "Charge Generation and Photovoltaic Operation of Solid-State Dye-Sensitized Solar Cells Incorporating a High Extinction Coefficient Indolene-Based Sensitizer" Adv. Funct. Mater. 19:1-9 (2009).
Snaith, "Charge Transport in Mesoscopic Hybrid Solar Cells" SPIE Newsroom (http://spie.org/x19330.xml? ArticleID=x19330), Published online Jan. 29, 2008.
Snaith et al., "SnO2-Based Dye-Sensitized Hybrid Solar Cells Exhibiting Near Unity Absorbed Photon-to-Electron Conversion Efficiency" Nano Lett. 10:1259-65 (2010).
Taguchi et al., "Improving the Performance of Solid-State Dye-Sensitized Solar Cell Using MgO-coated TiO2 Nanoporus Film" Chem. Commun. 2480-81 (2003).
Wang et al., "A Stable Quasi-Solid-State Dye-Sensitized Solar Cell with an Amphiphilic Ruthenium Sensitizer and Polymer Gel Electrolyte" Nat. Mater. 2:402-7 and 498 (2003).
Zhang et al., "Investigation of the Stability of Solid-State Dye-Sensitized Solar Cells" Res. Chem. Intermed. 33 (1-2):5-11 (2007).
O'Regan et al., "A Low-Cost, High Efficiency Solar Cell Based on Dye-Sensitized Colloidal TiO2 Films" Nature 353:737-40 (1991).
Tennakone et al., "Dye-Sensitized Solid-State Photovoltaic Cells: Suppression of Electron-Hole Recombination by Deposition of the Dye on a Thin Insulating Film in Contact with a Semiconductor" J. Electron. Mater. 30(8):992-6 (2001).

\* cited by examiner

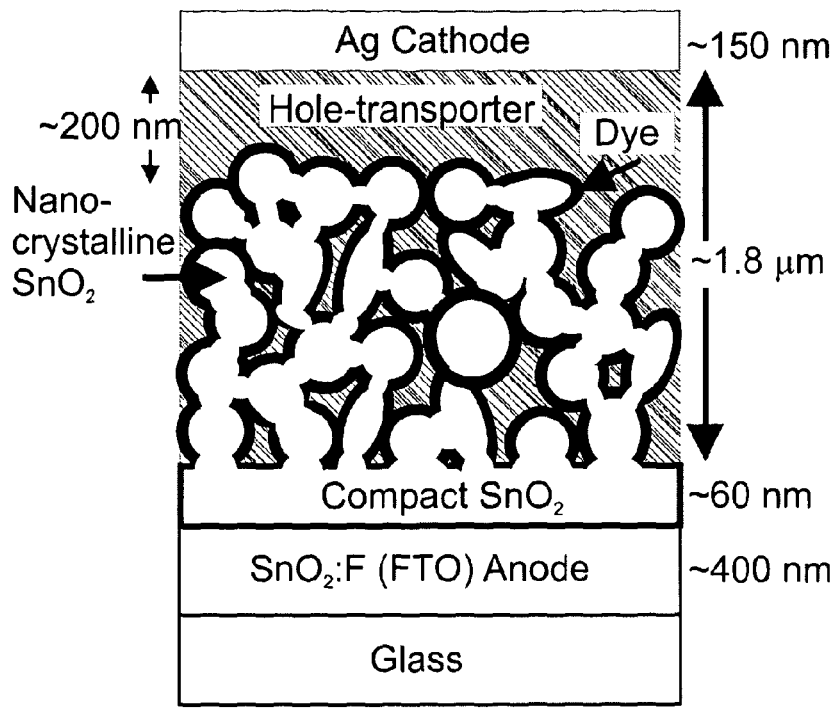
Figure 1 - Schematic diagram of a solid state dye sensitised solar cell formed with a mesoporous $SnO_2$ n-type semiconductor material.
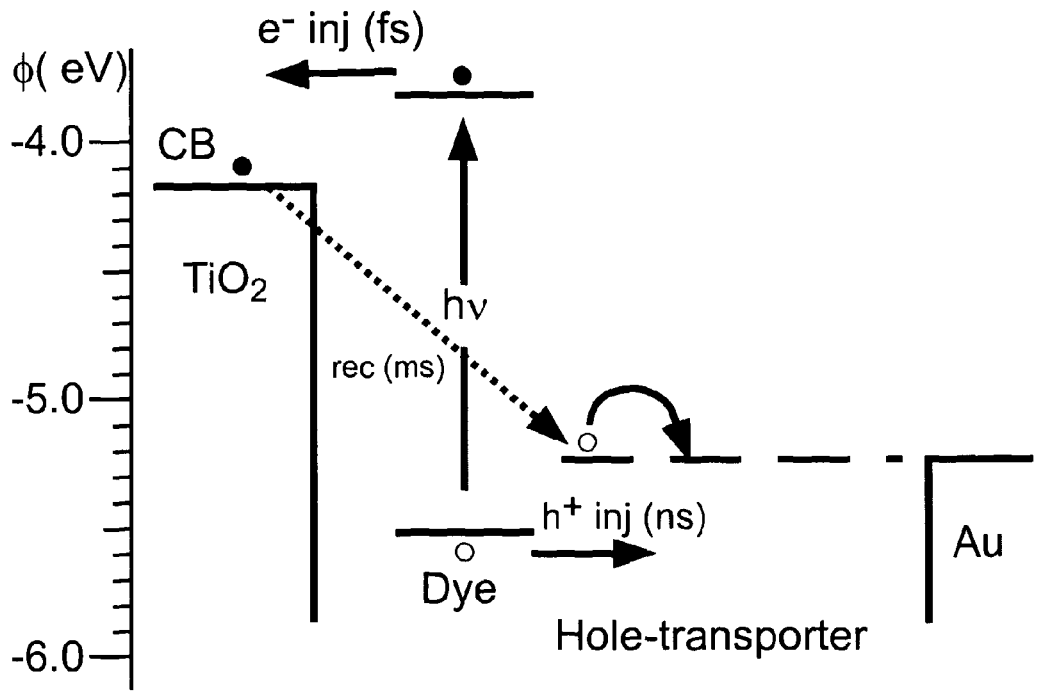
Figure 2 - Schematic representation of charge transfers taking place in DSC operation.

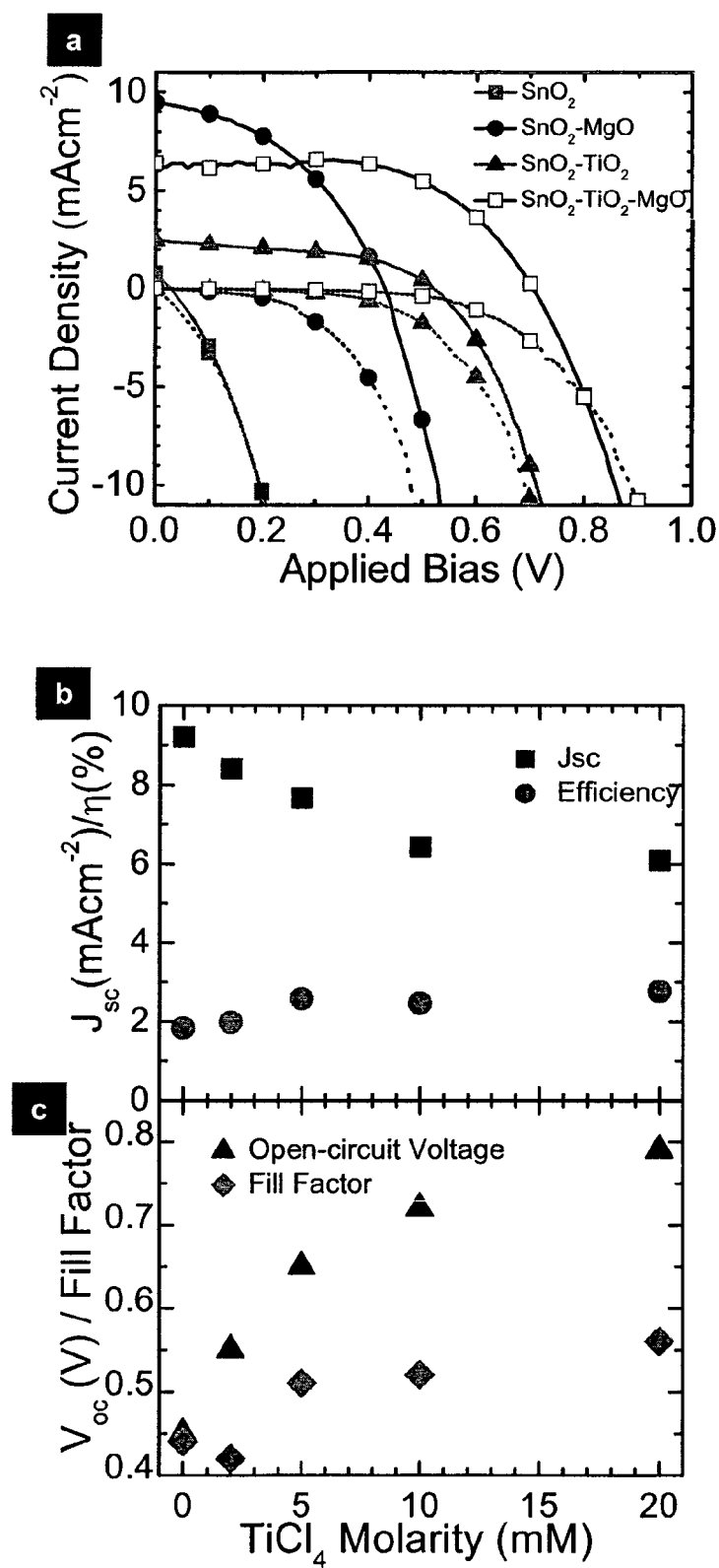
Figure 3. Performance of $SnO_2$-based SDSCs

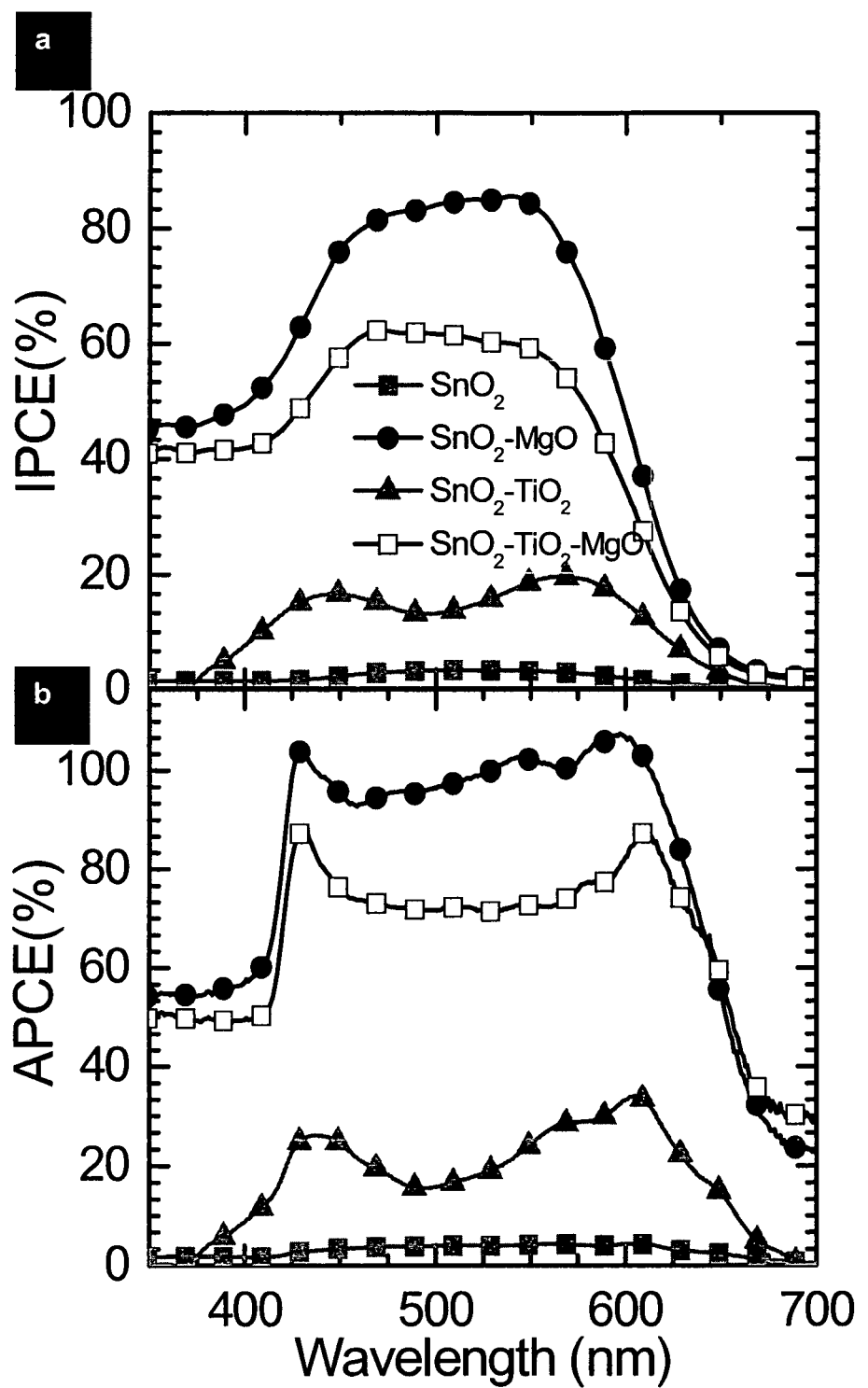
Figure 4. Light absorption characteristics of SnO$_2$-based SDSCs

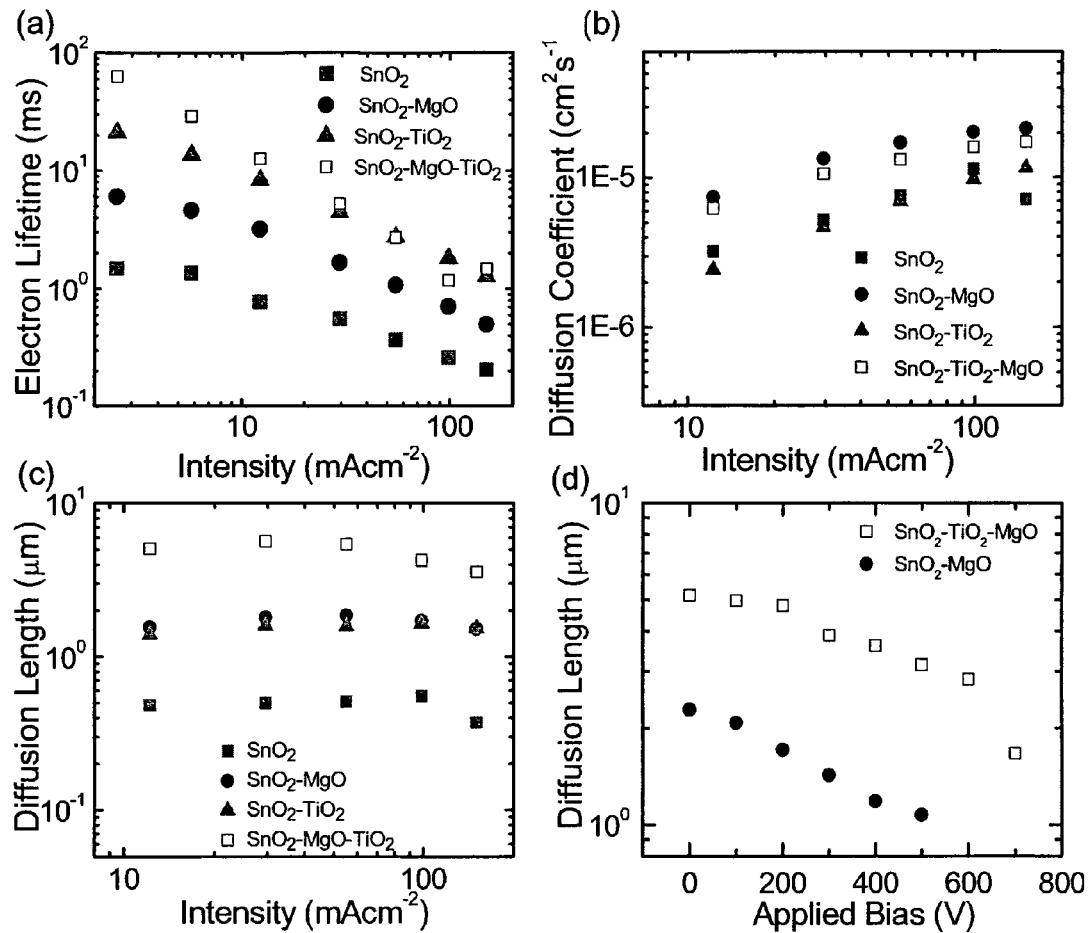
Figure 5. - Electron diffusion characteristics of SnO$_2$-based SDSCs

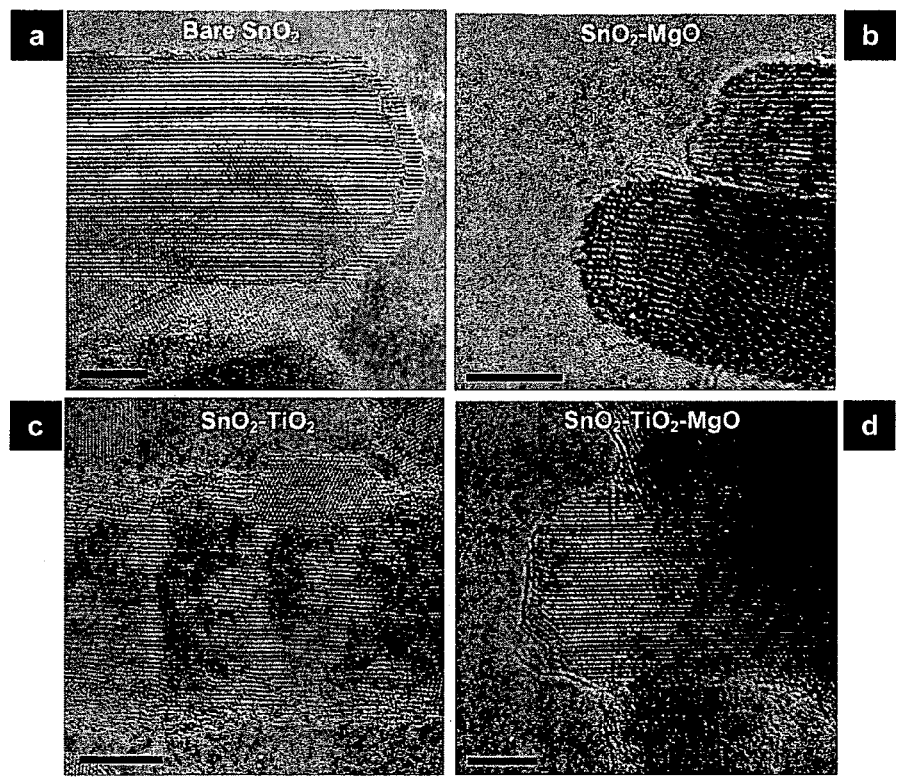
Figure 6 - HRTEM images of $SnO_2$ films uncoated and coated for use in accordance with the present invention.
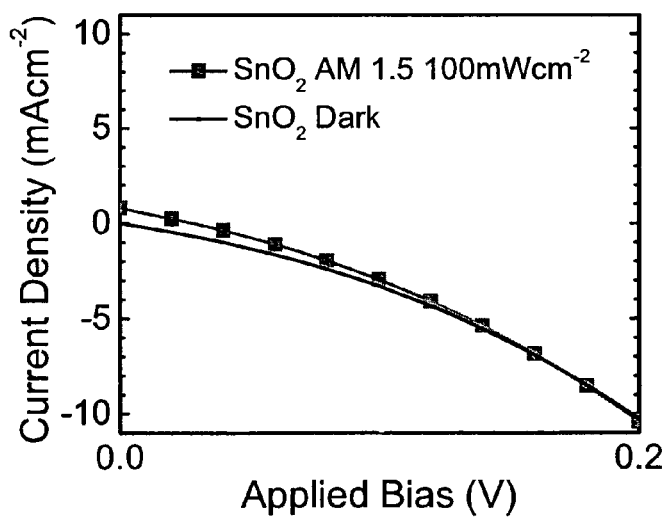
Figure 7 - . Performance of a comparative SDSC formed with bare $SnO_2$ having no surface coatings. Device structure: FTO/compact $SnO_2$/mesoporous $SnO_2$/dye/p-type hole-transporter\silver.

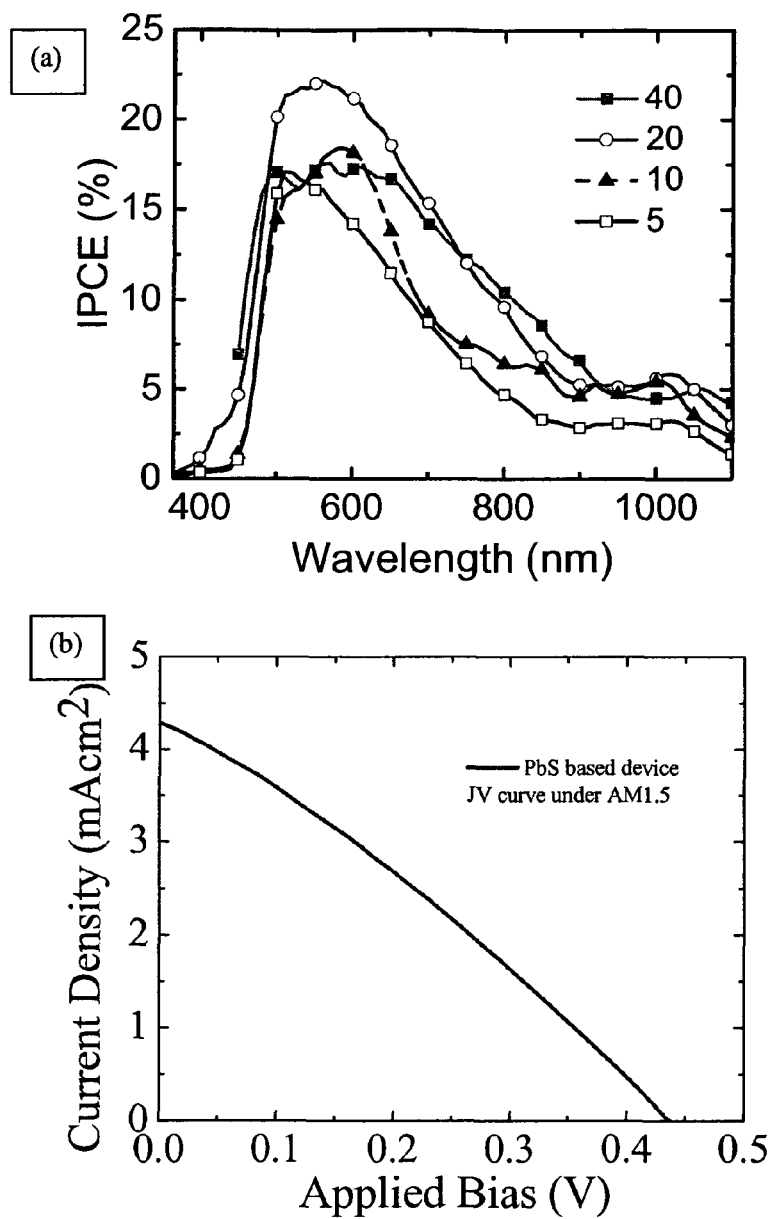
Figure 8. Spectral response (top) and current voltage curve (bottom) measured under AM 1.5 simulated sun light at 100mWcm$^{-2}$ intensity for a SnO$_2$-MgO / PbS QD/ Spiro-OMeTAD based solar cell.

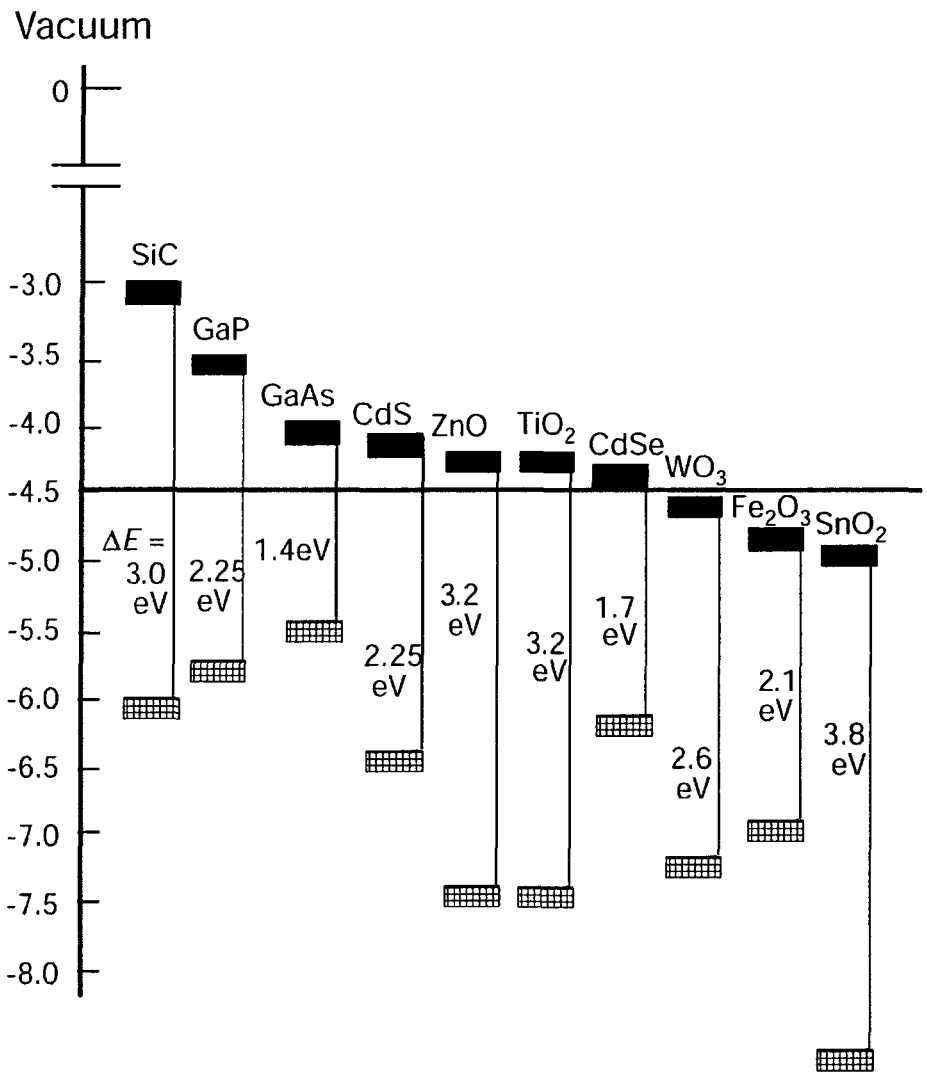
Figure 9 - Graphical representation of band gap and conduction bands in typical semiconductor materials useful in the present invention.

SOLID STATE HETEROJUNCTION DEVICE

CROSS-REFERENCE TO RELATED APPLICATIONS

This application is the National Stage of International Application No. PCT/GB2010/001117, filed on Jun. 8, 2010, which claims priority to United Kingdom Patent Application No. 0909818.7, filed on Jun. 8, 2009.

The present invention relates to a solid-state p-n heterojunction and to its use in optoelectronic devices, in particular in solid-state dye-sensitized solar cells (SDSCs) and corresponding light sensing devices.

The junction of an n-type semiconductor material (known as an electron transporter) with a p-type semiconductor material (known as a hole-transporter) is perhaps the most fundamental structure in modern electronics. This so-called "p-n heterojunction" forms the basis of most modern diodes, transistors and related devices including opto-electronic devices such as light emitting diodes (LEDs), photovoltaic cells, and electronic photo-sensors.

A realization of the pressing need to secure sustainable future energy supplies has led to a recent explosion of interest in photovoltaics (PV). Conventional semi-conductor based solar cells are reasonably efficient at converting solar to electrical energy. However, it is generally accepted that further major cost reductions are necessary to enable widespread uptake of solar electricity generation, especially on a larger scale. Dye-sensitized solar cells (DSCs) offer a promising solution to the need for low-cost, large-area photovoltaics. Typically, DSCs are composed of mesoporous $TiO_2$ (electron transporter) sensitized with a light-absorbing molecular dye, which in turn is contacted by a redox-active hole-transporting medium. Photo-excitation of the sensitizer leads to the transfer (injection) of electrons from the excited dye into the conduction band of the $TiO_2$. These photo-generated electrons are subsequently transported to and collected at the anode. The oxidized dye is regenerated via hole-transfer to the redox active medium with the holes being transported through this medium to the cathode.

The most efficient DSCs are composed of $TiO_2$ in combination with a redox active liquid electrolyte. Those incorporating an iodide/triiodide redox couple in a volatile solvent can convert over 12% of the solar energy into electrical energy. However, this efficiency is far from optimum. Even the most effective sensitizer/electrolyte combination which uses a ruthenium complex with an iodide/triiodide redox couple sacrifices approx. 600 mV in order to drive the dye regeneration/iodide oxidation reaction. Furthermore, such systems are optimised to operate with sensitizers which predominantly absorb in the visible region of the spectrum thereby losing out on significant photocurrent and energy conversion. Even in the most efficiently optimised liquid electrolyte-based DSCs, photons which are not absorbed between 600 and 800 nm amount to an equivalent of 7 $mA/cm^{-2}$ loss in photocurrent under full sun conditions. Other problems with the use of liquid electrolytes are that these are corrosive and often prone to leakage, factors which become particularly problematical for larger-scale installations or over longer time periods.

More recent work has focused on creating gel or solid-state electrolytes, or entirely replacing the electrolyte with a solid-state molecular hole-transporter which is much more appealing for large scale processing and durability. Of these alternatives, the use of a molecular hole-transporter appears to be the most promising. Though these solid-state DSCs (SDSCs) are a proven concept, the most efficient still only convert just over 5% of the solar energy into usable electrical power. This is still a long way off the efficiency of the liquid based cells and will require further optimisation before SDSCs can become a viable commercial prospect in routine applications.

One approach which has been investigated for improving the efficiency of solid-state DSCs is to drop the conduction band of the oxide to enable more efficient electron transfer from "low band gap" sensitizers, enabling a greater breadth of solar light harvesting. If, for example, electron transfer from an excited dye is problematic with $TiO_2$ then this should be resolved to some extent by the use of a material having a lower conduction band since it is energetically more favourable to facilitate rapid electron transfer.

Previously, a variety of semiconductor materials, including $SnO_2$ have been investigated for use in liquid electrolyte based DSCs and several, including $SnO_2$, have shown some degree of success, although the efficiency of devices made with $TiO_2$ n-type material is yet to be matched. There is, however, a notable gap in the published literature with regard to the use of $SnO_2$ electron transporters in solid-state p-n junction devices. In particular, although several authors have published generalised disclosures proposing. SDSCs formed from a generic set of materials (sometimes even listing $SnO_2$) as n-type electron transporters (see e.g. EP 1176646), not one functioning example of an $SnO_2$-based SDSC incorporating an organic hole-transporter (organic SDSC) has yet been reported. In their work to improve the conversion efficiency of SDSCs the present inventors have now investigated the effect of varying the n-type semiconductor material and may have established a likely cause of this apparent void in the reported art; $SnO_2$-based SDSCs of this type simply do not work. When used in organic solid-state DSCs in place of $TiO_2$, $SnO_2$ devices generate minimal photocurrent, resulting in solar to electrical power conversion efficiencies of only a fraction of 0.1%. This result is illustrated in FIG. 7 below. As a result, it is likely that if any such devices have previously been created, they have simply been abandoned as non-functional. Consequently, there is no known disclosure of any functional $SnO_2$-based organic SDSC.

Encouraged by the potential advantages of the lower conduction band in $SnO_2$, however, the present inventors have investigated the cause of this remarkably low efficiency provided by $SnO_2$-based organic SDSCs and attempted a variety of modifications by which this might be addressed. As a result of this work, the present inventors have surprisingly established that a very thin coating of a very high band-gap (i.e. insulating) material at the surface of the $SnO_2$ n-type material is sufficient to render the previously ineffective $SnO_2$-based SDSCs viable, and indeed is sufficient to provide an overall light conversion efficiency which is nearly as great as that provided by $TiO_2$-based SDSCs.

In a first aspect, the present invention therefore provides A solid-state p-n heterojunction comprising an organic p-type material in contact with an n-type material wherein said n-type material comprises $SnO_2$ having at least one surface-coating of a surface coating material having a conduction band edge closer to vacuum level and/or a higher band-gap than $SnO_2$. Preferably the junction will be light sensitised by use of at least one suitable sensitising material such as a dye and/or "quantum dot". The junction will also preferably comprise a solid p-type material (hole transporter) in the form of a molecular (optionally amorphous) organic compound.

The solid-state p-n heterojunctions of the present invention are particularly suitable for use in solar cells, photo-detectors and other optoelectronic devices. In a second aspect, the present invention therefore provides an optoelectronic device comprising at least one solid state p-n heterojunction of the invention.

In a corresponding further aspect, the present invention additionally provides the use of $SnO_2$ having at least one surface-coating of a surface coating material as described herein as an n-type material in a solid state p-n heterojunction. This will preferably be a heterojunction of the present invention as described herein.

In a still further aspect, the present invention provides a method for the manufacture of a solid-state p-n heterojunction comprising: forming a layer (optimally a porous layer) of an n-type semiconductor material comprising $SnO_2$ having at least one surface-coating of a material with a higher band-gap than $SnO_2$, optionally and preferably coating said n-type material with a light sensitising material such as a dye and/or "quantum dot", and contacting said n-type material with a solid state p-type semiconductor material, wherein said p-type material (hole transporter) is preferably a molecular organic compound, and/or a polymeric organic semiconductor. Typical routes by which the $SnO_2$ having at least one surface-coating of a material with a higher band-gap than $SnO_2$ may be generated include sintering of a layer of fine $SnO_2$ particles followed by surface coating of the sintered layer, and surface coating of fine $SnO_2$ particles, followed by sintering of a layer of the coated $SnO_2$ particles.

The solid-state p-n heterojunction formed or formable by any of the methods described herein evidently constitutes a further aspect of the invention, as do optoelectronic devices such as photovoltaic cells or light sensing devices comprising at least one such heterojunction.

The functioning of a DSC relies initially on the collection of solar light energy in the form of capture of solar photons by a sensitizer (typically a dye or "quantum dot"). The effect of the light absorption is to raise an electron into a higher energy level in the sensitizer. This excited electron will eventually decay back to its ground state, but in a DSC, the n-type material in close proximity to the sensitizer provides an alternative (faster) route for the electron to leave its excited state, viz. by "injection" into the n-type semiconductor material. This injection results in a charge separation, whereby the n-type semiconductor has gained a net negative charge and the dye a net positive. Since the dye is now charged, it cannot function to absorb a further photon until it is "regenerated" and this occurs by passing the positive charge ("hole") on to the p-type semiconductor material of the junction (the "hole transporter"). In a solid state device, this hole transporter is in direct contact with the dye material, while in the more common electrolytic dye sensitised photocells, a redox couple (typically iodide/triiodide) serves to regenerate the dye and passes the "hole" on to the p-type material. Once the electron is passed into the n-type material, it must then be transported away, with its charge contributing to the current generated by the solar cell.

While the above is a simplified summary of the ideal working of a DSC, there are certain processes which occur in any practical device in competition with these desired steps and which serve to decrease the conversion of sunlight into useful electrical energy. Decay of the sensitizer back to its ground state was indicated above, but in addition to this, there is the natural tendency of two separated charges of opposite sign to re-combine. This can occur by return of the electron into a lower energy level of the sensitizer, or by recombination of the electron directly from the n-type material to quench the hole in the p-type material. In an electrolytic DSC, there is additionally the opportunity for the separated electron to leave the surface of the n-type material and directly reduce the iodide/iodine redox couple. Evidently, each of these competing pathways results in the loss of potentially useful current and thus a reduction in cell energy-conversion efficiency.

A schematic diagram indicating some of the key steps in electrical power generation from a DSC is given in attached FIG. 1.

Although in general it is advantageous for every step in the charge-transfer process to be as fast as possible, the present inventors believe that in some cases the speed of the above-described competing pathways can be related to the rate of a desirable charge transfer. Thus, an increase in the rate of one desirable step may result in another desirable link in the chain being overwhelmed by the resulting accelerated charge recombination. Without being bound by theory, this is believed by the inventors to account for the remarkably poor performance of SDSCs formed with "bare" $SnO_2$ n-type semiconductors.

The rates of many of the charge-transfer steps in a DSC-type optoelectronic device are highly dependent upon the environment in which the relevant materials are held. For example, although the "injection" step of transferring an excited electron from a sensitizer to the n-type material is essentially quantitative in electrolyte-based DSCs, in solid state devices this step is relatively slow and a significant proportion of electrons are quenched by other pathways before they can be transferred to a standard $TiO_2$ based n-type material. $SnO_2$, however, has a deeper conduction band than $TiO_2$, and in principle should facilitate more efficient electron transfer from photoexcited dye molecules. As described above, however, the actual efficiency of such devices is remarkably low and the inventors postulate that this is due to competing charge-recombinations. Specifically, the charge transferred to the $SnO_2$ material will be recombining much more rapidly in the SDSC since this is a single electron process. In the electrolyte based DSC the recombination is a very slow process due to multiple steps in the dye-regeneration and recombination.

Most unexpectedly, however, the present inventors have established that a thin surface coating of a high band-gap/high band gap edge (insulating) material, on the surface of the $SnO_2$ n-type semiconductor can greatly reduce this fast recombination from the $SnO_2$ material. This is in direct contradiction to previous studies which have been carried out using electrolyte-based DSCs, which indicated that although an insulating layer could reduce the relatively slow recombination with the redox electrolyte, a layer sufficiently thick to make any useful reduction in recombination to a molecule (such as a dye or molecular hole-transporter) would essentially prevent injection of the excited electron from the dye into the n-type material. For example, Green et al. (J. Phys Chem. B 109, 12525-12533, 2005) state that "the addition of MgO blocking layers is shown to be effective at reducing recombination losses to the redox electrolyte but is found to be unable to retard recombination dynamics to the dye cation" (see abstract). Green et al. also conclude that by the use of insulating layers on $SnO_2$ it will be "very difficult" to achieve devices superior to $TiO_2$.

Thus, although previous work in this area has indicated that high band gap coatings would not be of benefit in avoiding recombination to the dye cation, the present inventors have now developed SDSCs having an n-type semiconductor of $SnO_2$ coated with a high band-gap material which have an overall total conversion efficiency of more than 30 times that of the uncoated equivalent, and in some cases rivaling that of the most efficient and highly optimised $TiO_2$-based SDSCs.

The p-n heterojunctions of the invention, as well as those used within or generated by alternative aspects of the invention, are preferably light sensitive and as such preferably incorporate at least one light sensitising material. Such light sensitising materials may be dyes, quantum dots, or any material which generates an electronic excitation as a result of photon absorption.

The most commonly used light sensitising materials in DSCs are organic or metal-complexed dyes, and these have been widely reported in the art and the skilled worker will be aware of many existing sensitizers, all of which are suitable in all appropriate aspects of the invention and consequently are reviewed here only briefly.

A common category of organic dye sensitizers are indolene based dyes, of which D102 shown below is demonstrated in the attached Examples.

The general structure of indolene dyes is that of Formula sI below:

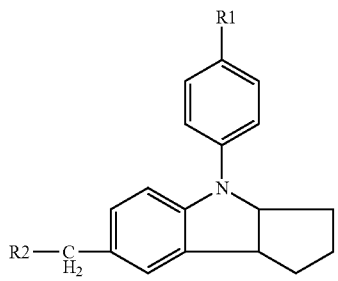

Formula sI wherein R1 and R2 are independently optionally substituted alkyl, alkenyl, alkoxy, heterocyclic and/or aromatic groups, preferably with molecular weight less than around 360 amu. Most preferably, R1 will comprise aralkyl, alkoxy, alkoxy aryl and/or aralkenyl groups (especially groups of formula $C_xH_yO_z$ where x, y and z are each 0 or a positive integer, x+z is between 1 and 16 and y is between 1 and 2x+1) including any of those indicated below for R1, and R2 will comprise optionally substituted carbocyclic, heterocyclic (especially S and/or N-containing heterocyclic) cycloalkyl, cycloalkenyl and/or aromatic groups, particularly those including a carboxylic acid group. All of the groups indicated below for R2 are highly suitable examples. One preferred embodiment of R2 adheres to the formula $C_xH_yO_zN_vS_w$ where x, y, z, v and w are each 0 or a positive integer, x+z+w+v is between 1 and 22 and y is between 1 and 2x+v+1. Most preferably, z≥2 and in particular, it is preferable that R2 comprises a carboxylic acid group. These R1 and R2 groups and especially those indicated below may be used in any combination, but highly preferred combinations include those indicated below:

| Dye Name | R1 | R2 |
|---|---|---|
| $D_{149}$ | $Ph_2C=CH$ | Et, N, S, S, S, N, $HO_2C-C_{H_2}$, O |
| $D_{102}$ | $Ph_2C=CH$ | S, S, N, $HO_2C-C_{H_2}$, O |
| $D_{77}$ | OMe | S, S, N, $HO_2C-C_{H_2}$, O |
| $D_{103}$ | OMe (phenyl) | S, S, N, $HO_2C-C_{H_2}$, O |
| $D_{131}$ | $Ph_2C=CH$ | CN, $HO_2C$ |
| $D_{120}$ | OMe | CN, $HO_2C$ |

Indolene dyes are discussed, for example, in Horiuchi et al. J Am. Chem. Soc. 126 12218-12219 (2004), which is hereby incorporated by reference.

A further common category of sensitizers are ruthenium metal complexes, particularly those having two bipyridyl coordinating moieties. These are typically of formula sII below

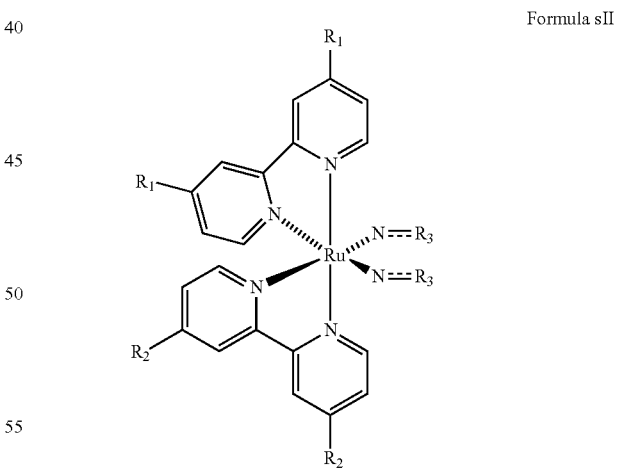

Formula sII wherein each R1 group is independently a straight or branched chain alkyl or oligo alkoxy chain such as $C_nH_{2n+1}$ where n is 1 to 20, preferably 5 to 15, most preferably 9, 10 or 11, or such as $C—(—XC_nH_{2n}—)_m—XC_pH_{2p+1}$, where n is 1, 2, 3 or 4, preferably 2, m is 0 to 10, preferably 2, 3 or 4, p is an integer from 1 to 15, preferably 1 to 10, most preferably 1 or 7, and each X is independently O, S or NH, preferably O; and wherein each R2 group is independently a carboxylic acid or alkyl carboxylic acid, or the salt of any such acid (e.g.

the sodium, potassium salt etc) such as a $C_nH_{2n}COOY$ group, where n is 0, 1, 2 or 3, preferably 0 and Y is H or a suitable metal such as Na, K, or Li, preferably Na; and wherein each R3 group is single or double bonded to the attached N (preferably double bonded) and is of formula CHa-Z or C═Z, where a is 0, 1 or 2 as appropriate, Z is a hetero atom or group such as S, O, SH or OH, or is an alkyl group (e.g. methylene, ethylene etc) bonded to any such a hetero atom or group as appropriate; R3 is preferably ═C═S.

A preferred ruthenium sensitizer is of the above formula sII, wherein each R1 is nonyl, each R2 is a carboxylic acid or sodium salt thereof and each R3 is double-bonded to the attached N and of formula ═C═S. R1 moieties of formula sII may also be of formula sIII below:

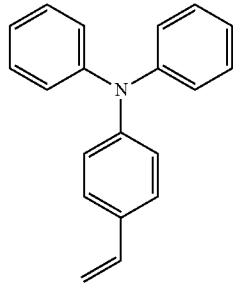

Formula sIII

Ruthenium dyes are discussed in many published documents including, for example, Kuang et al. Nano Letters 6 769-773 (2006), Snaith et al. Angew. Chem. Int. Ed. 44 6413-6417 (2005), Wang et al. Nature. Materials 2, 402-498 (2003), Kuang et al. Inorganica Chemica Acta 361 699-706 (2008), and Snaith et al. J Phys, Chem. Lett. 112 7562-7566 (2008), the disclosures of which are hereby incorporated herein by reference, as are the disclosures of all material cited herein.

Other sensitizers which will be known to those of skill in the art include Metal-Phalocianine complexes such as zinc phalocianine PCH001, the synthesis and structure of which is described by Reddy et al. (Angew. Chem. Int. Ed. 46 373-376 (2007)), the complete disclosure of which (particularly with reference to Scheme 1), is hereby incorporated by reference, Metal-Porphyrin complexes, Squaraine dyes, Thiophene based dyes, fluorine based dyes, molecular dyes and polymer dyes. Examples of Squaraine dyes may be found, for example in Burke et al., *Chem. Commun.* 2007, 234, and examples of polyfluorene and polythiothene polymers in McNeill et al., *Appl. Phys. Lett.* 2007, 90, both of which are incorporated herein by reference.

A further type of sensitizer which is highly appropriate for use in all aspects of the present invention is the so-called "quantum dot". Quantum dots (also known as "nano-dots" or "Q-dots") are semiconductor particles of nanometer size wherein a gradual translation from solid state to molecular structure occurs as the particles size decreases. The quantum dots are adsorbed at the heterojunction constituted by the n-type semiconductor (coated as indicated herein) and the p-type semiconductor. As quantum dots, particles consisting of CdS, $Bi_2S_3$, $Sb_2S_3$ or $Ag_2S$ may be used, whereas PbS is preferred. Other compounds suitable for making quantum-dots are InAs, CdTe, CdSe, HgTe. Solid solutions of HgTe and CdTe or of HgSe and CdSe are also suitable.

In the present invention, quantum dot sensitizers function exactly as dye sensitizers, whereby light is adsorbed by the Q-dots and produces electron-hole pairs. The electrons are injected from the Q-dots into the electron conducting solid (n-type material) while the holes are injected in the hole conducting side of the junction (p-type material). In this way electric power is produced from light. Quantum dot sensitized heterojunction cells offer several advantages. The band gaps and thereby the absorption ranges are adjustable through the particle size or by adjusting the relative concentrations of components in solid solutions like HgTe/CdTe or HgSe/CdSe. The band gap of these solutions may be adjusted to approach the optimal value for conversion of sunlight to electric power, which is about 1.3 eV for single junction and 0.9 eV as the IR absorbing cell in a tandem junction cell.

Another advantage is that the optical cross section of the Q-dots is significantly larger than the one of the molecular dyes. This allows the use of thinner films resulting in higher photovoltages as well as better fill factors of the cell, and hence higher conversion yields. In one embodiment, the n-type material of the junctions and devices of the present invention may be planar or substantially planar rather than porous. Sensitisation with Q-dots as described herein is particularly suitable for such planar, substantially planar or low porosity n-type materials (e.g. as described below). The production of a $TiO_2$-based SDSC sensitized with quantum dots is described in EP 1176646, the content of which is hereby incorporated by reference. An example of a cell of the present invention sensitised with PbS quantum dots is also provided below in the examples section (see examples and FIG. 8).

Although many of the dyes indicated above show broad spectrum absorption in the visible region, one of the key advantages of the present invention is that the lower conduction band of $SnO_2$ allows injection of electrons excited by slightly lower energy solar photons including those of near infra-red frequencies. Sensitisation over such a broad spectrum may be possible with a single sensitizing agent, but it may also be an advantage to include two or more sensitizers, for example with complimentary absorption characteristics. In one preferred embodiment, all aspects of the present invention are suitable for use with co-sensitisation using a plurality of (e.g. at least 2, such as 2, 3, 4 or 5) different sensitizing agents. Some complimentary parings include, for example, the near-infra red absorbing zinc phalocianine dyes referred to above in combination with indoline or ruthenium-based sensitizers to absorb the bulk of the visible radiation. As an alternative, a polymeric or molecular visible light absorbing material may be used in conjunction with a near IR absorbing dye, such as a visible light absorbing polyfluorene polymer with a near IR absorbing zinc phlaocianine or squaraine dye.

In all aspects of the present invention a solid state hole transporter is a key constituent, since this forms the p-type material of the p-n heterojunction. The hole transporter will preferably be a molecular p-type material rather than an inorganic material such as a salt, and more preferably will be an organic molecular material. Suitable materials will typically comprise an extended pi-bonding system through which charge may readily pass. Suitable materials will also preferably be amorphous or substantially amorphous solids rather than being crystalline at the appropriate working temperatures (e.g. around 30-70° C.). The organic hole-transporter would preferably have a high energy HOMO to LUMO transition, rendering its predominant function dye-regeneration and hole-transport. However, it may optionally have a narrow HOMO to LUMO transition, with its additional function being to absorb solar light, and subsequently transfer an electron to the $SnO_2$, or its excited state energy to a dye molecule tethered to the $SnO_2$ surface. The then excited dye molecule would subsequently transfer an electron to the $SnO_2$ and the hole to the hole-transporter, as part of the photovoltaic conversion process.

According to a preferred embodiment, the solid state hole transporter is a material comprising a structure according to any of formulae (tI), (tII), (tIII), (tIV) and/or (tV) below:

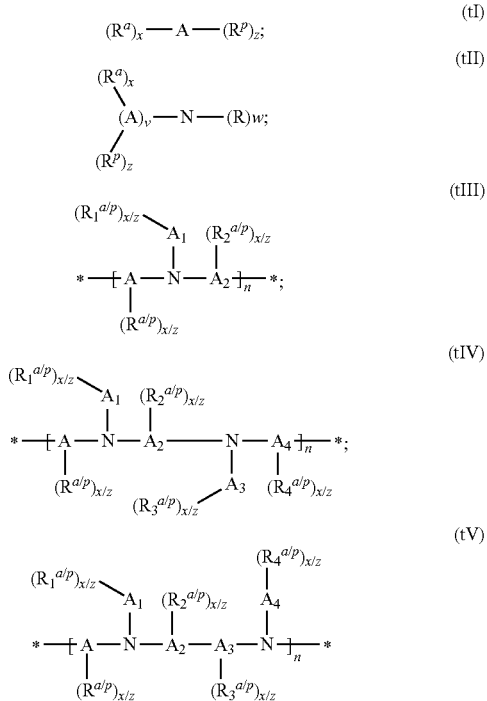

in which N, if present, is a nitrogen atom;
n, if applicable, is in the range of 1-20;
A is a mono-, or polycyclic system comprising at least one pair of a conjugated double bond (—C=C—C=C—), the cyclic system optionally comprising one or several heteroatoms, and optionally being substituted, whereby in a compound comprising several structures A, each A may be selected independently from another A present in the same structure (tII-tV);
each of $A_1$-$A_4$, if present, is an A independently selected from the A as defined above;
v in (tII) recites the number of cyclic systems A linked by a single bond to the nitrogen atom and is 1, 2 or 3;
(R)w is an optional residue selected from a hydrocarbon residue comprising from 1 to 30 carbon atoms, optionally substituted and optionally comprising 1 or several heteroatoms, with w being 0, 1 or 2 provided that v+w does not exceed 3, and, if w=2, the respective $Rw_1$ or $Rw_2$ being the same or different;
Ra represents a residue capable, optionally together with other Ra present on the same structure (tI-tV), of decreasing the melting point of an organic compound and is selected from a linear, branched or cyclic alkyl or a residue comprising one or several oxygen atoms, wherein the alkyl or the oxygen comprising residue is optionally halogenated;
x is the number of independently selected residues Ra linked to an A and is selected from 0 to a maximum possible number of substituents of a respective A, independently from the number x of other residues Ra linked to another A optionally present;
with the proviso that per structure (tI-tV) there is at least one Ra being an oxygen-containing residue as defined above; and, if several Ra are present on the same structure (I-V), they are the same or different; and wherein two or more Ra may form an oxygen-containing ring;
Rp represents an optional residue enabling a polymerisation reaction with compounds comprising structure (tI-tV) used as monomers, and/or a cross-linking between different compounds comprising structures (tI-tV);
z is the number of residues Rp linked to an A and is 0, 1, and/or 2, independently from the number z of other residues Rp linked to another A optionally present;
Rp may be linked to an N-atom, to an A and/or to a substituent Rp of other structures according (tI-tV), resulting in repeated, cross-linked and/or polymerised moieties of (tI-tV);
$(R^{a/p})_{x/z}$ and $(R_{1-4}{}^{a/p})_{x/z}$, if present, represent independently selected residues Ra and Rp as defined above.

Preferably, the charge transporting material comprises compounds having the structures (tI)-(tV).

General reference to the several structures, such as in the references "(tI-tV)", "(tVII-tXVI)", or "$A_1$-$A_4$", for example, means reference to any one selected amongst (tI); (tII), (tIII), (tIV), or (tV), any one selected amongst (tVII), (tVIII), (tIX), (tX), (tXI), (tXII), (tXIII), (tXIV), (tXV) or (tXVI), or any one selected amongst $A_1$, $A_2$, $A_3$ or $A_4$, respectively. In addition, in the charge transporting material for use in the invention, for example, different compounds of structures (tI-tV) may be combined and, if desired cross-linked and/or polymerised. Similarly, in any structure (tI-tV), different structures for A may be selected independently, for example from (tVII-tXVI).

According to a preferred embodiment, the organic charge transporting material of the device of the invention comprises a structure according to formula (tVI):

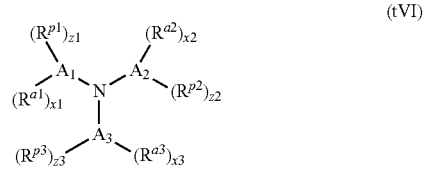

in which Ra1, Ra2 and Ra3 and x1, x2 and x3 are defined, independently, like Ra and x, respectively, above;
Rp1, Rp2 and Rp3 and z1, z2 and z3 are defined, independently, like Rp and z, respectively, above. Formula (tVI) thus represents a specimen of formula (tII) above, in which v is 3, and in which R(w) is absent.

Preferably, A is a mono- or polycyclic, optionally substituted aromatic system, optionally comprising one or several heteroatoms. Preferably, A is mono-, bi- or tricyclic, more preferably mono-, or bicyclic. Preferably, if one or more heteroatoms are present, they are independently selected from O, S, P, and/or N, more preferably from S, P and/or N, most preferably they are N-atoms.

According to a preferred embodiment, A is selected from benzol, naphthalene, indene, fluorene, phenanthrene, anthracene, triphenylene, pyrene, pentalene, perylene, indene, azulene, heptalene, biphenylene, indacene, phenalene, acenaphtene, fluoranthene, and heterocyclic compounds such as pyridine, pyrimidine, pyridazine, quinolizidine, quinoline, isoquinoline, quinoxaline, phtalazine, naphthyridine, quinazoline, cinnoline, pteridine, indolizine, indole, isoindole, carbazole, carboline, acridine, phenanthridine, 1,10-phenanthroline, thiophene, thianthrene, oxanthrene, and derivatives thereof, each of which may optionally be substituted.

According to a preferred embodiment, A is selected from structures of formula (tVII-tXIV) given below:

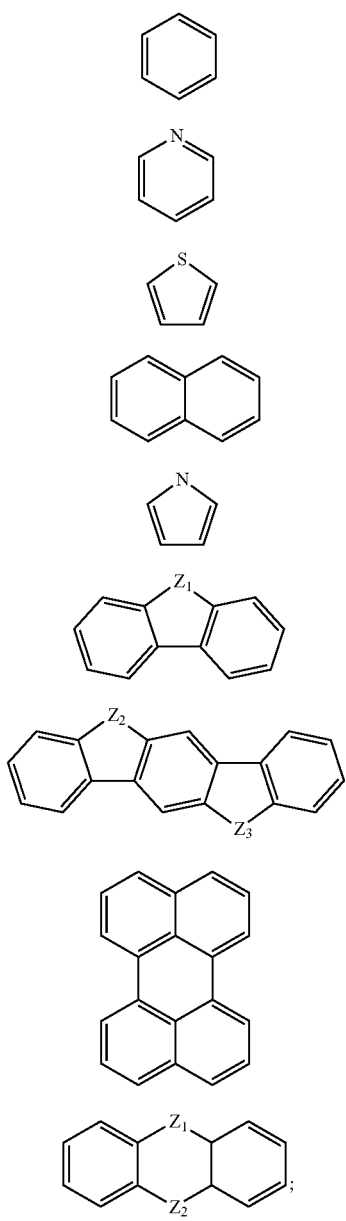

in which each of $Z^1$, $Z^2$ and $Z^3$ is the same or different and is selected from the group consisting of O, S, SO, $SO_2$, $NR^1$, $N^+(R^{1'})(1''')$, $C(R^2)(R^3)$, $Si(R^{2'})(R^{3'})$ and $P(O)(OR^4)$, wherein $R^1$, $R^{1'}$ and $R^{1'''}$ are the same or different and each is selected from the group consisting of hydrogen atoms, alkyl groups, haloalkyl groups, alkoxy groups, alkoxyalkyl groups, aryl groups, aryloxy groups, and aralkyl groups, which are substituted with at least one group of formula —$N^+(R^5)_3$ wherein each group $R^5$ is the same or different and is selected from the group consisting of hydrogen atoms, alkyl groups and aryl groups, $R^2$, $R^3$, $R^{2'}$ and $R^{3'}$ are the same or different and each is selected from the group consisting of hydrogen atoms, alkyl groups, haloalkyl groups, alkoxy groups, halogen atoms, nitro groups, cyano groups, alkoxyalkyl groups, aryl groups, aryloxy groups and aralkyl groups or $R^2$ and $R^3$ together with the carbon atom to which they are attached represent a carbonyl group, and $R^4$ is selected from the group consisting of hydrogen atoms, alkyl groups, haloalkyl groups, alkoxyalkyl groups, aryl groups, aryloxy groups and aralkyl groups.

Preferred embodiments of, structure (tXV) for A may be selected from structures (tXVI) and (tXVIa) below:

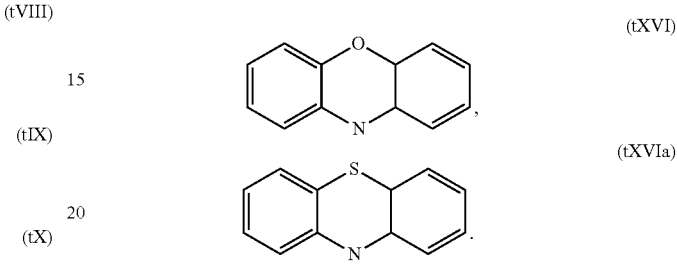

Preferably, in any structure of (tI-tV) all A are the same, but differently substituted. For example, all A are the same, some of which may be substituted and some of which are not. Preferably, all A are the same and identically substituted.

Any A may be substituted by other substituents than Ra and/or Rp. Other substituents may be selected at the choice of the skilled person and no specific requirements are indicated herein with respect to them. Other substituents may thus correspond to (R)w in (tII) defined above. Other substituents and R(w) may generally be selected from linear, branched or cyclic hydrocarbon residues comprising from 1 to 30 carbon atoms, optionally substituted and optionally comprising 1 or several heteroatoms, for example. The hydrocarbon may comprise C—C single, double or triple bonds. For example, it may comprise conjugated double bonds. For example, optional other residues on A may be substituted with halogens, preferably —F and/or —Cl, with —CN or —$NO_2$, for example.

One or more carbon atoms of other substituents of A may or may not be replaced by any heteroatom and/or group selected from the group of —O—, —C(O)—, —C(O)O—, —S—, —S(O)—, $SO_2$—, —S(O)$_2$O—, —N═, —P═, —NR'—, —PR'—, —P(O)(OR')—, —P(O)(OR')O—, —P(O)(NR'R')—, —P(O)(NR'R')O—, P(O)(NR'R')NR'—, —S(O)NR'—, and —S(O)$_2$NR', with R' being H, a C1-C6 alkyl, optionally partially halogenated.

According to a preferred embodiment, any A may optionally be substituted with one or several substituents independently selected from nitro, cyano, amino groups, and/or substituents selected from alkyl, alkenyl, alkynyl, haloalkyl, alkoxy, and alkoxyalkyl groups, including substituted substituents. Alkyl, alkenyl, alkynyl, haloalkyl, alkoxy and alkoxyalkyl are as defined below.

Preferably, further residues optionally present on A, such as R(w) in (tII), for example, are selected from C4-C30 alkenes comprising two or more conjugated double bonds.

Ra may be used as a residue capable of controlling the melting point of an organic, charge-transporting compound. The reference with respect to the ability to control the melting point is the same charge transporting material devoid of the at least one residue Ra. In particular, the function of Ra is to provide a charge transporting material that adopts the desired phase at the temperatures indicated herein. The adjustment of the melting point to obtain the desired characteristics in the temperature ranges indicated above may be brought about by a single residue Ra or a combination of identical or different residues Ra, present in any of the structures (tI)-(tV).

At least one linear, branched or cyclic residue containing one or several oxygen atoms may be used for lowering the melting point, and thus the absence of such residues or alternative residues may be used to correspondingly raise melting points, thus obtaining the desired characteristics. Other residues, include for example alkyls as defined below, may assist in the adjustment of the melting point and/or phase characteristics.

Ra may be halogenated and/or perhalogenated in that one, several or all H of the residue Ra may be replaced with halogens. Preferably, the halogen is fluorine.

If Ra is oxygen containing compound, it is preferably a linear, branched, or cyclic saturated C1-C30 hydrocarbon comprising 1-15 oxygen atoms, with the proviso that the number of oxygen atoms does preferably not exceed the number of carbons. Preferably, Ra comprises at least 1.1 to 2 as much carbon as oxygen atoms. Preferably, Ra is a C2-C20, saturated hydrocarbon comprising 2-10 oxygen atoms, more preferably a C3-C10 saturated hydrocarbon comprising 3-6 oxygen atoms.

Preferably, Ra is linear or branched. More preferably Ra is linear.

Preferably, Ra is selected from a C1-C30, preferably C2-C15 and most preferably a C3-C8 alkoxy, alkoxyalkyl, alkoxyalkoxy, alkylalkoxy group as defined below.

Examples of residues Ra may independently be selected from the following structures:

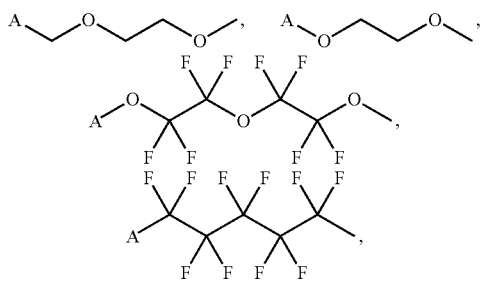

with A indicating any A in formula (tI-V) above.

Any Ra present may be linked to a carbon atom or a heteroatom optionally present in A. If Ra is linked to a heteroatom, it is preferably linked to a N-atom. Preferably, however, any Ra is linked to a carbon atom. Within the same structure (tI-tV), any Ra may be linked to a C or a heteroatom independently of another Ra present on the same A or in the same structure.

Preferably, every structure A, such as A, $A_1$, $A_2$, $A_3$ and $A_4$, if present in formulae (tI-tV) above comprises at least one residue Ra. For example, in the compound according to structure (tI-tV), at least one structure A comprises an oxygen containing residues Ra as defined above, whereas one or more other and/or the same A of the same compound comprise an aliphatic residue Ra, for example an alkyl group as defined below, preferably a C2-C20, more preferably C3-C15 alkyl, preferably linear.

The following definitions of residues are given with respect to all reference, to the respective residue, in addition to preferred definitions optionally given elsewhere. These apply specifically to the formulae relating to hole transporters (tN formulae) but may optionally also be applied to all other formulae herein where this does not conflict with other definitions provided.

An alkoxyalkoxy group above is an alkoxy group as defined below, which is substituted with one or several alkoxy groups as defined below, whereby any substituting alkoxy groups may be substituted with one or more alkoxy groups, provided that the total number of 30 carbons is not exceeded.

An alkoxy group is a linear, branched or cyclic alkoxy group having from 1 to 30, preferably 2 to 20, more preferably 3-10 carbon atoms.

An alkoxyalkyl group is an alkyl group as defined below substituted with an alkoxy group as defined above.

An alkyl group is a linear, branched and/or cyclic having from 1-30, preferably 2-20, more preferably 3-10, most preferably 4-8 carbon atoms. An alkenyl groups is linear or branched C2-C30, preferably C2-C20, more preferably C3-C10 alkenyl group. An alkynyl group is a linear or branched C2-C30, preferably C2-C20, more preferably C3-C10 linear or branched alkynyl group. In the case that the unsaturated residue, alkenyl or alkynyl has only 2 carbons, it is not branched.

A haloalkyl groups above is an alkyl groups as defined above which is substituted with at least one halogen atom.

An alkylalkoxy group is an alkoxy group as defined above substituted with at least one alkyl group as defined above, provided that the total number of 30 carbons is not exceeded.

The aryl group above and the aryl moiety of the aralkyl groups (which have from 1 to 20 carbon atoms in the alkyl moiety) and the aryloxy groups above is an aromatic hydrocarbon group having from 6 to 14 carbon atoms in one or more rings which may optionally be substituted with at least one substituent selected from the group consisting of nitro groups, cyano groups, amino groups, alkyl groups as defined above, haloalkyl groups as defined above, alkoxyalkyl groups as defined above and alkoxy groups as defined above.

The organic charge transporting material may comprise a residue Rp linked to an A. According to a preferred embodiment, Rp is selected from vinyl, allyl, ethinyl, independently from any other Rp optionally present on the A to which it is linked or optionally present on a different A within the structures (tI) and/or (tII).

The charge transporting material comprised in the device of the invention may be selected from compounds corresponding to the structures of formulae (tI-tV) as such. In this case, n, if applicable, is 1 and the charge transporting material comprises individual compounds of formulae (tI-tV), or mixtures comprising two or more different compounds according formulae (tI-tV).

The compounds of structures (tI-tV) may also be coupled (e.g. dimerised), olilgomerised, polymerized and/or crosslinked. This may, for example, be mediated by the residue Rp optionally present on any of the structures (tI-tV). As a result, oligomers and/or polymers of a given compound selected from (tI-tV) or mixtures of different compounds selected from structures (tI-tV) may be obtained to form a charge transporting material. Small n is preferably in the range of 2-10.

A particularly preferred organic molecular hole transporter contains a spiro group to retard crystallisation. A most preferred organic hole transporter is a compound of formula tXVII below, and is described in detail in Snaith et al. Applied Physics Letters 89 262114 (2006), which is herein incorporated by reference.

Formula tXVII

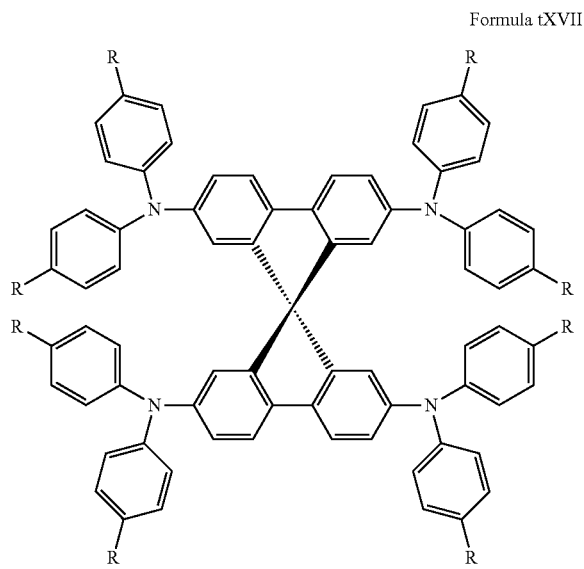

wherein R is alkyl or O-alkyl, where the alkyl group is preferably methyl, ethyl, n-propyl, iso-propyl, n-butyl, sec-butyl or tert-butyl, preferably methyl.

The n-type material of the solid state heterojunctions relating to all aspects of the present invention is $SnO_2$ having at least one surface-coating of a material as described herein. It is common practice in the art to generate p-n heterojunctions, especially for optical applications, from a mesoporous layer of the n-type material so that light can interact with the junction at a greater surface than could be provided by a flat junction. In the present case, this mesoporous layer of coated $SnO_2$ is conveniently generated by sintering of $SnO_2$ particles using methods well known in the art and described, for example in Green et al. (J. Phys. Chem. B 109 12525-12533 (2005)) and Kay et al. (Chem. Mater. 17 2930-2835 (2002)), which are both hereby incorporated by reference. With respect to the surface coatings, these may be applied before the particles are sintered into a film, after sintering, or two or more layers may be applied at different stages, as described below.

Typical particle diameters for the $SnO_2$ will be dependent upon the application of the device, but might typically be in the range of 5 to 1000 nm, preferably 10 to 100 nm, more preferably still 10 to 30 nm, such as around 20 nm. Surface areas of 1-400 $m^2g^{-1}$ are preferable in the finished film, more preferably 30-200 $m^2g^{-1}$, such as 40-100 $m^2g^{-1}$. The film will preferably be electrically continuous (or at least substantially so) in order to allow the injected charge to be conducted out of the device. The thickness of the film will be dependent upon factors such as the photon-capture efficiency of the photo-sensitizer, but may be in the range 0.05-100 μm, such as 0.5-10 μm, preferably 1 to 5 μm. In one alternative embodiment, the film is planar or substantially planar rather than highly porpous, and for example has a surface area of 1 to 20 $m^2g^{-1}$ preferably 1 to 10 $m^2g^{-1}$. Such a substantially planar film may also or alternatively have a thickness of 0.05 to 5 μm, preferably 0.1 to 2 μm. In one embodiment, the substantially planar films of the invention are preferably sensitized with quantum dot sensitizers as described herein.

Materials which are suitable as the coating material (the "surface coating material") will have a conduction band edge closer to the vacuum level (vacuum energy) and/or a band gap higher than that of $SnO_2$. They may have a band gap of, for example, 2 to 8 eV, preferably 3.8 or 3.9 to 8 eV, such as 4.6 to 8 eV. Additionally or alternatively, the surface coating material may have a conduction band edge higher (less negative and thus closer to vacuum level) than $SnO_2$. They may have a conduction band edge relative to vacuum level of at around −4.8 eV, or higher (less negative) for example −4.8 or −4.7 to −1 eV, such as −4.7 to −2.5 eV, or −4.5 to −3 eV Suitable materials include single metal oxides such as MgO, $Al_2O_3$, ZrO, ZnO, $HfO_2$, $TiO_2$, $Ta_2O_5$, $Nb_2O_5$, $WO_3$, $W_2O_5$, $In_2O_3$, $Ga_2O_3$, $Nd_2O_3$, $Sm_2O_3$, $La_2O_3$, $Sc_2O_3$, $Y_2O_3$, NiO, $MoO_3$, PbO, CdO and/or MnO; compound metal oxides such as $Zn_xTi_yO_z$, $ZrTiO_4$, $ZrW_2O_8$, $SiAlO_{3.5}$, $Si_2AlO_{5.5}$, $SiTiO_4$ and/or $AlTiO_5$; doped metal oxides such as any of the single or compound metal oxides indicated above doped with at least one of Al, F, Ge, S, N, In, Mg, Si, C, Pb and/or Sb; carbonates such as $Cs_2C_5$; sulphides such as PbS, CdS, CuS; selenides such as PbSe, CdSe; tellurides such as CdTe; nitrides such as TiN; and/or multicompound semiconductors such as $CIGaS_2$. Some typical and preferred materials suitable for surface coating are shown below in FIG. 9, with a representation of their conduction band edges and/or band gaps also shown. These materials are discussed in Grätzel (Nature 414 338-344 (2001)). The most preferred surface coating material is MgO.

The coating on the n-type material will typically be formed by the deposition of a thin coating of material on the surface of the $SnO_2$ film or the particles which are to generate such a film. In most cases, however, the material will be fired or sintered prior to use, and this may result in the complete or partial integration of the surface coating material into the $SnO_2$. Thus although the surface coating may be a fully discrete layer at the surface of the $SnO_2$ film, the coating may equally be a surface region in which the $SnO_2$ is merged, integrated, or co-dispersed with the coating material.

Since the coating may not be a fully discrete layer of material, it is difficult to indicate the exact thickness of an appropriate layer. The appropriate thickness will in any case be evident to the skilled worker from routine testing, since a sufficiently thick layer will retard electron-hole recombination without undue loss of charge injection into the n-type material. Coatings from a monolayer to a few nm in thickness are appropriate in most cases (e.g. 0.1 to 100 nm, preferably 1 to 5 nm).

The $SnO_2$ which forms the bulk or "core" of the n-type material in all embodiments of the present invention may be essentially pure $SnO_2$, e.g. having only unavoidable impurities, or may alternatively be doped in order to optimise the function of the p-n-heterojunction device, for example by increasing or reducing the conductivity of the $SnO_2$ or by matching the conduction band in the $SnO_2$ to the excited state of the chosen sensitizer.

Thus the $SnO_2$ referred to herein (where context allows) may be essentially pure $SnO_2$ or alternatively may be doped throughout with at least one dopant material of greater valency than Sn (i.e valancy >4, n-type doping) and/or may be doped with at least one dopant material of lower valency than Sn (i.e. valancy <4-p-type doping). n-type doping will tend to increase the n-type character of the $SnO_2$ material while p-type doping will tend to reduce the degree of the natural n-type state (e.g. due to defects).

Such doping may be made with any suitable element including F, Sb, N, Ge, Si, C, In, InO and/or Al. Suitable dopants and doping levels will be evident to those of skill in the art. Doping levels may range from 0.01 to 49% such as 0.5 to 20%, preferably in the range of 5 to 15%. All percentages indicated herein are by weight where context allows, unless indicated otherwise.

An alternative or additional method by which the properties of the coated $SnO_2$ n-type material may be controlled in all aspects of the present invention is by the use of at least one intermediate coating in addition to the high band-gap (insulating) coating of "surface coating material" described herein above. In a further embodiment, therefore, the invention allows for the solid state p-n heterojunction as described herein wherein said $SnO_2$ is coated with at least two materials and wherein the outermost coating (that furthest from the outside surface of the $SnO_2$ n-type material and thus closest to the p-type material of the junction) is a surface-coating of the "surface coating material" (e.g. a material with a higher band-gap than $SnO_2$ and/or higher (less negative/closer to vacuum level) conduction band edge than $SnO_2$, as described herein).

The intermediate coating or coatings between the $SnO_2$ bulk material and the outer "insulating" coating or surface coating material may serve to further retard recombination of the injected electron with the dye cation or hole on the hole-transporter, or may preferably serve to modify the energy levels of the n-type material to match effectively with the excited state of the sensitizer, maximising photovoltage. In the former case, the material will preferably be a material with a higher band-gap or conduction band edge than $SnO_2$ (such as those described herein above) and in the latter case the material will preferably be a material with a band gap similar to that of $SnO_2$ but optionally and preferably additionally having a conduction band energy closer to the vacuum level than $SnO_2$. Materials having a band gap similar to that of $SnO_2$ may, have a band gap of $3 \pm 1.5$ eV, for example $3.5 \pm 0.8$ eV Suitable materials for at least one optional intermediate coating in any aspect of the invention include: single metal oxides such as MgO, $Al_2O_3$, ZrO, ZnO, $HfO_2$, $TiO_2$, $Ta_2O_5$, $Nb_2O_5$, $WO_3$, $W_2O_5$, $In_2O_3$, $Ga_2O_3$, $Nd_2O_3$, $Sm_2O_3$, $La_2O_3$, $Sc_2O_3$, $Y_2O_3$, NiO, $MoO_3$, PbO, CdO and/or MnO; compound metal oxides such as $Zn_xTi_yO_z$, $ZrTiO_4$, $ZrW_2O_8$, $SiAlO_{3.5}$, $Si_2AlO_{5.5}$, $SiTiO_4$ and/or $AlTiO_5$; doped metal oxides such as any of the single or compound metal oxides indicated above doped with at least one of Al, F, Ge, S, N, In, Mg, Si, C, Pb and/or Sb; carbonates such as $Cs_2C_5$; sulphides such as PbS, CdS, CuS; selenides such as PbSe, CdSe; tellurides such as CdTe; nitrides such as TiN; and/or multicompound semiconductors such as $CIGaS_2$. The most preferred intermediate coating is $TiO_2$. The most preferred combination of coatings is a surface coating of MgO in combination with an intermediate coating of $TiO_2$. Thicknesses for the intermediate coating or coatings will be such as to provide the desired effect on the properties of the n-type semiconductor material, although those coating thicknesses indicated above for the outer insulator coating form appropriate examples.

Where at least one optional intermediate coating is present then the intermediate coating material from which at least one intermediate coating is formed will be a different material from the surface coating material. In particular, the (any) intermediate coating adjacent to the surface coating will be of a different material from the surface coating material. In one preferable embodiment, all intermediate coatings, where present, will be of a different material from the surface coating material. Preferably, where at least one optional intermediate coating is present then the intermediate coating material from which at least one intermediate coating is formed will be of higher band gap and/or of conduction band edge closer to vacuum level in comparison with the surface coating material. In particular, the (any) intermediate coating adjacent to the surface coating will be of a material with a higher band gap and/or with conduction band edge closer to vacuum level in comparison with the surface coating material. In one preferable embodiment, all intermediate coatings, where present, will be of a material of higher band gap and/or of conduction band edge closer to vacuum level in comparison with the surface coating material.

The p-n heterojunction comprising an n-type material formed of $SnO_2$ having a surface coating and at least one intermediate coating as described herein forms a further aspect of the present invention. In this aspect, the $SnO_2$, the coatings and the junction may preferably conform to any of the embodiments indicated herein. Furthermore, in this "multiple coating" aspect the hole conductor material may be a liquid organic hole conductor, an inorganic hole conductor (e.g. CuI), an electrolyte hole conductor or any of the solid organic molecular hole conductors indicated herein. This allows the advantages of multiple coatings on $SnO_2$, such as matching of the conduction band edge, to be obtained on a still wider range of heterojunctions. The heterojunctions will be formable by the methods indicated herein and by other methods well known in the art. Evidently, corresponding solar (photovoltaic) cells and photo-sensing devices form corresponding aspects of the invention.

The method of the present invention provides for the production of a solid state p-n heterojunction by contacting an n-type semiconductor material as described in any of the embodiments herein with a p-type semiconductor material, particularly one as described herein.

The formation of the n-type semiconductor material of $SnO_2$ having at least one surface coating as described herein may be carried out by any appropriate method. The film may be substantially compact and planar or may be porous, especially mesoporous. The formation of porous, especially mesoporous films may again be by any suitable method, although these primarily divide into two main procedures. The first method is to generate a mesoporous layer of $SnO_2$ having appropriate properties and then to treat this with the coating material or materials. The second method is to treat the $SnO_2$ particles with the coating material or materials and subsequently generate an appropriate layer. Evidently, and especially where more than one layer is to be formed (e.g. in those embodiments having an intermediate coating as described herein), a combination of the two methods may be used.

The method of generating a $SnO_2$ film and subsequently coating the film is illustrated in the Examples below and has been reported for the formation of electrolyte-containing DSCs by Green et al. (J. Phys Chem. B 109, 12525-12533, 2005).

Typical steps for the generation of such a coated film of $SnO_2$ particles include:
- a1) Preparing a paste of $SnO_2$ nanoparticles with a combustible material such as an organic material, e.g. a wax or polymer).
- a2) Generating a film from the paste to an appropriate thickness.
- a3) Sintering the film at a suitable temperature (e.g. 70 to 700° C., especially 400 to 500° C.) for between 10 minutes and 8 hours, preferably between 15 minutes and 2 hours.
- a4) Coating the film by immersion in a solution of an appropriate coating material or a pre-cursor thereof (which will generate the desired material upon heat treatment).
- a5) Optionally repeating step a4, preferably after drying of the film.
- a6) Optionally and preferably sintering the film again at a suitable temperature (e.g. 70 to 700° C., especially 400 to 500° C.) for between 1 minutes and 8 hours, preferably between 5 minutes and 1 hour.

a7) Optionally repeating steps a4 to a5 to generate more than one coating.

The method of coating $SnO_2$ particles followed by generation of a film from such coated particles uses equivalent techniques to those exemplified herein, except that the treatment steps are carried out in a differing order. Such films have been reported for use in electrolyte-containing DSCs by Kay et al. (Chem. Mater 14 2930-2935 (2002).

Typical steps for the generation of such a film of coated $SnO_2$ particles include:

b1) Coating $SnO_2$ particles by immersion in a solution of an appropriate coating material or a pre-cursor thereof (which will generate the desired material upon heat treatment).

b2) Optionally repeating step b1).

b3) Preparing a paste of coated $SnO_2$ nanoparticles with a combustible material such as an organic material, e.g. a wax or polymer).

b4) Generating a film from the paste to an appropriate thickness.

b5) Sintering the film at a suitable temperature (e.g. 70 to 700° C., especially 400 to 500° C.) for between 10 minutes and 8 hours, preferably between 15 minutes and 2 hours.

b6) Optionally carrying out steps a4 to a7 (above) to generate further coatings over the film of sintered coated particles.

In an alternative embodiment, the $SnO_2$ can take the form of a flat compact film. This may be advantageous, for example, for sensitizing with materials with very strong optical densities or large excitation diffusion lengths, such as polymeric semiconductors and quantum dots. Evidently, the "flat" (e.g. substantially planar) $SnO_2$ electrodes will be coated with at least one surface coating material (e.g. wide-band gap material) as indicated herein.

The invention is illustrated further in the following non-limiting examples and in the attached Figures, in which:

FIG. 1 represents an organic solid state dye sensitised solar cell formed with a mesoporous $SnO_2$ n-type semiconductor material FIG. 2—shows a schematic representation of charge transfers taking place in DSC operation. hv indicates light absorption, e⁻inj=electron injection, rec=recombination between electrons in the n-type and holes in the p-type material, h⁺inj=hole-transfer (dye regeneration) CB=conduction band.

FIG. 3a represents the current voltage curves for solid-state DSCs measured under AM 1.5 simulated sun light of 100 mWcm⁻², incorporating bare $SnO_2$, $SnO_2$ coated with $TiO_2$, $SnO_2$ coated with. MgO, and $SnO_2$ doubly-coated with $TiO_2$ and MgO.

FIGS. 3b, c represent solar cell performance parameters extracted from current voltage curves measured under simulated AM 1.5 sun light of 100 mWcm⁻², for $SnO_2$ based solid-state DSCs incorporating MgO shells deposited from a 120 mM solution of magnesium acetate, with the addition of an "interlayer" of $TiO_2$ (between the $SnO_2$ and MgO) deposited from an aqueous solution of $TiCl_4$ with a range of molarities. 3b) shows short-circuit current and power conversion efficiency and 3c) shows open-circuit voltage and fill factor.

FIG. 4 represents the photovoltaic action spectra for the same SDSCs as measured in FIG. 3a, presented as a) incident photon-to-electron conversion efficiency (IPCE) and b) absorbed photon-to-electron conversion efficiency (APCE). The total light absorption in the film has been estimated by measuring the reflection spectra of a silver coated device in an integrating sphere. We note silver electrodes are used in the actual devices.

FIG. 5a shows the electron lifetime as a function of background white light intensity for solid-state DSCs incorporating bare $SnO_2$, $SnO_2$—MgO, $SnO_2$—$TiO_2$ and $SnO_2$—$TiO_2$—MgO electrodes, measured at open-circuit via the small perturbation transient photo voltage decay technique.

FIG. 5b shows effective electron diffusion coefficient (estimated using $D_e=w^2/2.35\tau_{trans}$) for the same cells as measured in FIG. 5a as a function of background white light intensity, measured at short-circuit by transient photo current decay technique.

FIG. 5c Represents electron diffusion length (estimated using $L_D=\sqrt{D_e \times \tau_e}$) for the same cells, estimated at short-circuit using the Diffusion coefficients from FIG. 5b and estimating the electron lifetime at short-circuit using the constant current transient photo voltage technique.

FIG. 5d shows the electron diffusion length for solid-state DSCs incorporating $SnO_2$—MgO and $SnO_2$—$TiO_2$—MgO electrodes as a function of applied bias, measured at 100 mWcm⁻² white light background illumination intensity.

FIG. 6 shows high resolution transmission electron micrograph (HRTEM) images of $SnO_2$ nanocrystals within the mesoporous films fabricated from sintered nanoparticle paste. a) bare $SnO_2$. b) $SnO_2$ with an MgO coating from a 120 mM magnesium acetate solution. c) $SnO_2$ with a $TiO_2$ coating from a 20 mM $TiCl_4$ solution. d) $SnO_2$ with $TiO_2$ (20 mM) and MgO (120 mM) coatings. All films were first sintered to 500° C. degrees prior to surface treatment and then once more to 500° C. after all surface treatments. The scale markers correspond to 5 nm.

FIG. 7 shows the performance of a comparative, bare $SnO_2$ based, SDSC composed of $SnO_2$ compact layer/Mesoporous $SnO_2$/D102 sensitizer/Spiro-OMeTAD hole-transporter (with Li-TFSI and tBP added).

FIG. 8a shows the IPCE spectra for solid state DSCs composed of $SnO_2$ coated with MgO, sensitized with PbS nanoparticles. The $SnO_2$—MgO electrodes were sensitized with the PbS nanoparticles by dipcoating and subsequent ligand exchange method. The legend refers to the number of dips.

FIG. 8b shows the current voltage curve for a PbS sensitised $SnO_2$—MgO based solid-state DSC measured under AM1.5 simulated sun light of 100 mWcm⁻².

FIG. 9 shows a graphical representation of the band gap and conduction bands in typical semiconductor materials useful as surface and/or intermediate coating materials in the present invention. Band gaps (ΔE) shown as numbers in eV, horizontal bars represent the edges of the conduction (upper, solid) and valance (lower, hatched) bands. Scales shows voltage offset in eV relative to vacuum level. Horizontal line at −4.5 eV represents 0V relative to standard hydrogen electrode.

Example 1a

Solar Cell Fabrication

Fluorine doped $SnO_2$ (FTO) glass sheets (Nippon SG) were partially etched with Zn powder and HCl to reveal the electrode pattern, and a thin (60 nm) compact layer of $SnO_2$ was deposited via spray pyrolysis deposition (SPD) at 450° C. from a solution of butyl-(tin chloride) (Aldrich) in anhydrous ethanol at 1:10 volume ratio. The SPD was performed through a physical mask to ensure it only deposited on the FTO and not on the etched glass region. The $SnO_2$ particles were synthesized via hydrolysis of $SnCl_4$ in water. The synthesized $SnO_2$ particles were precipitated and redispersed in ethanol, and mixed with ethyl cellulose and Terpinol to create a paste. The $SnO_2$ paste was doctor bladed upon the compact layer coated FTO sheets to give a dry film thickness of around 1.8 µm. The films were placed on a hot plate and slowly ramped up to 500° C. following the protocol for $TiO_2$ based SDSCs (see Snaith, H. J. et al., *Nanotechnology* 19, 424003 (2008)).

Once cooled, some of the films were subjected to further surface treatments. Some films were dipped in a hot (~60 to 70° C.) solution of magnesium acetate in ethanol with concentrations varying from 10 to 120 mM for one minute. Alternatively, the films were immersed in an aqueous $TiCl_4$ bath at concentrations varying from 2 to 20 mM at 70° C. for 1 hour. Other films were first submersed in the $TiCl_4$ bath for 1 hour (varying molarities), dried and subsequently submersed in the magnesium acetate bath (varying molarities) for one minute. Following surface treatments the films were rinsed thoroughly in ethanol, dried and re-annealed to 500° C. for 45 minutes.

Electron micrographs showing the film structure with and without a surface coating of MgO and an intermediate coating of $TiO_2$ are presented in FIG. 6.

Upon cooling to 70° C. all films were submersed in an acetonitrile:tert-butanol 1:1 solution of the indolene based dye D102 (Schmidt-Mende, L. et al., *Advanced Materials* 17 (7), 813 (2005)) at 0.2 mM concentration for one hour. After dyeing, the films were rinsed in acetonitrile, dried and the hole-transporter solution was deposited on top, left for 20 seconds and spin-coated at 2000 rpm for 25 seconds. The hole-transporter solution was composed of 180 mg/ml spiro-OMeTAD in chlorobenzene with addition of 17 µl tBP/ml chlorobenzene and 37 µl Li-TFSI solution (170 mg/ml in ACN)/ml chlorobenzene. The solar cells were completed by depositing 150 nm of silver via shadow mask thermal evaporation under high vacuum.

Example 1b

Modification for Semiconductor Nanoparticle Sensitization

The method of Example 1a may be varied for devices sensitized with PbS nanoparticles: Upon cooling to room temperature the films were taken into a nitrogen filled glove box. A hexane solution of PbS nanoparticles with oleic acid as a ligand had been previously prepared. A second acetonitrile solution of ethylene dithiol (EDT) (20 mM) had also been prepared. The mesoporous films were dipped in the PbS nanoparticle solution and withdrawn to coat with PbS nanoparticles. The films were subsequently dried and dipped in the EDT solution and withdrawn. The EDT acts as to replace the oleic acid ligand, enabling close contact between the $SnO_2$ based electrode and the PbS. This dipping process was repeated multiply to increase the loading of PbS nanoparticles. After sensitization, the films were dried and the hole-transporter solution was deposited on top, left for 20 seconds and spin-coated at 2000 rpm for 25 seconds. The hole-transporter solution was composed of 180 mg/ml spiro-OMeTAD in chlorobenzene with addition of 17 µl tBP/ml chlorobenzene and 37 µl Li-TFSI solution (170 mg/ml in ACN)/ml chlorobenzene. The solar cells were completed by depositing 150 nm of silver via shadow mask thermal evaporation under high vacuum Example 2

Solar Cell Testing

AM 1.5 solar illumination was generated from an Abet Technologies Class AAB solar simulator with an AM 1.5 global filter. The intensity was calibrated with a calibrated silicon reference cell incorporating a KG5 filter in order to minimize the solar spectral mismatch factor when measuring the DSCs, which are only photoactive in the visible region. The electronic measurements were taken with a Keithley 2400 sourcemeter interfaced to a PC. For the spectral response, monochromatic light was generated by focusing a 300 W Xenon lamp (Oriel) through a monochromator (Princeton Acton). The spectrally resolved output light intensity was calibrated with a silicon reference diode (~3 $mWcm^{-2}$), and the electrical response of the solar cells and reference diode were recorded with a Keithley 2636 interfaced to a PC. Optical masks of approximately 0.12 $cm^{-2}$ were used to define the area of the solar cell for both the measurements under simulated sun and the spectral response.

FIG. 3a shows the current voltage curves for solid-state DSCs prepared in accordance with Example 1a incorporating "bare" $SnO_2$, $SnO_2$ coated with $TiO_2$, $SnO_2$ coated with MgO, and $SnO_2$ doubly-coated with $TiO_2$ and MgO. The solid-state DSC incorporating "bare" $SnO_2$ can barely be considered a solar cell. Although the photocurrent at short-circuit is measurable (~1 $mAcm^{-2}$), the dark current entirely dominants for very small applied biases and the open-circuit voltage is only a few tens of mV leading to a power conversion efficiency of less than 0.05%.

Incorporating a "shell" of MgO coated from as little as 10 mM solution concentration, results in the photocurrent rocketing to over 9 $mAcm^{-2}$ and the efficiency jumps to 1.5%. In FIG. 3a the JV curve for a cell coated with MgO from a 120 mM solution is shown, where the short-circuit current is 9.5 $mAcm^{-2}$ and the efficiency is 1.8%. It is noted that this is a significantly higher photocurrent than that previously reported for the best performing solid-state DSCs measured under standard calibrated conditions, using this or any other dye. For the $SnO_2$—$TiO_2$ based devices the photocurrent is much improved (3.55 $mAcm^{-2}$) in comparison to bare $SnO_2$. The double coating enables tuning of the photovoltage and fill factor. As the concentration of the $TiO_2$ precursor is increased the open-circuit voltage and fill factor monotonically increase (up to a certain concentration), reaching maximum values of over 800 mV and 0.6 respectively, competitive with the most optimized state-of-the-art titania based cells. Though there is a sacrifice to the photocurrent, the maximum solar power conversion efficiency generated by the $SnO_2$—$TiO_2$—MgO based cells increases to around 2.8%. The solar cell performance parameters for the curves presented in FIG. 3 are presented in Table 1:

TABLE 1

| Device: | $SnO_2$ | $SnO_2$—MgO | $SnO_2$—$TiO_2$ | $SnO_2$—$TiO_2$—MgO |
|---|---|---|---|---|
| $J_{sc}$ ($mAcm^{-2}$) | 0.79 | 9.5 | 2.45 | 6.6 |
| $V_{oc}$ (V) | 0.03 | 0.43 | 0.52 | 0.71 |
| Fill Factor | 0.23 | 0.42 | 0.49 | 0.59 |
| Efficiency (%) | 0.005 | 1.77 | 0.63 | 2.80 |

FIGS. 3b and 3c show the evolution of the solar cell performance parameters with increasing "inter" $TiO_2$ content. This demonstrates the versatility of this technique to tuning the properties of the $SnO_2$ electrode.

As an alternative to using an organic molecular dye, low band gap nanoparticles can also be used as sensitizers, as described above in example 1b. FIG. 8a shows the photovoltaic action spectra for solid-state DSCs incorporating mesoporous $SnO_2$—MgO electrodes sensitized with PbS nanoparticles which have a 1.1 eV optical band-gap (see Example 1b). The curves are shown for differing degrees of sensitization. FIG. 8b shows the current voltage curve for a similar device to those presented in FIG. 8a (20 dip coating cycles) measured under Am 1.5 simulated sun light of 100 mWcm$^{-2}$. The solar cell performance characteristics derived from this JV curve are: $J_{sc}$=4.3 mAcm$^{-2}$, $V_{oc}$=0.44 V, Fill Factor=0.29, and Efficiency=0.55%.

Example 3

UV-Vis Reflection Measurements

UV-vis reflection measurements were performed with a Varian Carry 300 spectrophotometer with an integrating sphere accessory. The integrating sphere was calibrated with a Spectralon standard. Silver metal was evaporated over the entire device substrate (1.96 cm$^2$) after testing, and the silver coated films were placed on the back side of the integrating sphere positioned at an 8° angle to the incident light. The light was incident through the FTO coated glass. All light reflected back out the front of the cell at all angles was collected in the integrating sphere and the total attenuation within the cell estimated. For this measurement it is assumed that all light which is not reflected back into the integrating sphere is absorbed in the photoactive layer.

FIGS. 4a and 4b show the photovoltaic action spectra for the devices of Example 1a. The IPCE spectra follow the same trend observed for the short-circuit photocurrent, with the $SnO_2$—MgO based cell exhibiting record IPCE values of over 80% between 450 to 550 nm. Integrating this IPCE spectra over the AM 1.5 solar spectra at 100 mWcm$^{-2}$ estimates a short-circuit photocurrent of 9.9 mAcm$^{-2}$, in close agreement with the maximum measured value of 9.5 mAcm$^{-2}$ under simulated conditions. To compare with standard all-titania based cells using this same dye a maximum IPCE of between 40 to 60% is observed.

To estimate the efficiency of converting absorbed photons to collected electrons, the amount of light absorbed in the cell is quantified by measuring the UV-Vis reflection spectra in an integrating sphere from the actual measured solar cells coated entirely with silver following electrical characterization. The absorbed photon-to-current conversion efficiency (APCE) spectra, for all device configurations are shown in FIG. 4b. The $SnO_2$—MgO cell has an APCE of approximately 100% between 425 and 600 nm, demonstrating close to unity efficiency in charge generation and collection. The drop in APCE for wavelengths lower than 425 nm coincides with the onset of absorption in the spiro-OMeTAD hole-transporter.

Example 4

Transient Photovoltage and Photocurrent Measurements

Transient photovoltage and photocurrent measurements were performed as described in Snaith, H. J. et al., *Nanotechnology* 19, 424003 (2008).

The electron lifetime under open-circuit conditions was estimated by exposing the device to a short light pulse imposed upon a larger background white light illumination while the device is connected to the high impedance port (1 MΩ) on the oscilloscope (open-circuit). Since negligible charge leaves the device the transient decay of the photovoltage is directly proportional to the decay of charge within the solar cell. FIG. 5a shows the estimated electron lifetime under open-circuit conditions as a function of background light intensity for the devices of Example 1a. Comparing the "bare" SnO2 to the SnO2-MgO based devices, the recombination is slowed approximately three to five fold. The SnO2-TiO2 based cell has even slower recombination, especially at low light levels, and the $SnO_2$—$TiO_2$—MgO is reduced further still, with a maximum lifetime of ~60 ms at low light levels, as compared to just over 1 ms for the device incorporating "bare" $SnO_2$ at low light levels. As is observed for all cells, the recombination lifetime reduces with increasing light intensity, likely to be due to the nature of bimolecular recombination which scales as the product of the electron and hole number density.

The current collection lifetime is measured by "short-circuiting" the device through the low impedance port on the oscilloscope, and once again exposing the device to a short light pulse, imposed upon a larger background white light illumination. From the transient current collection times the effective electron diffusion coefficient $D_e$ can be estimated following $D_e$=w$^2$/2.35$\tau_{trans}$, where $t_{trans}$ is the 1/e current collection lifetime (see van de Lagemaat, J. et al., *J. Phys. Chem. B.* 105 (45), 11194 (2001)). We also account for recombination in the cell during the current collection. The diffusion coefficient is presented for all device in FIG. 5b. All cells exhibit a diffusion coefficient which increases with increasing light intensity, consistent with multi-trapping charge transport occurring in this material composite: the multi-trap model for charge transport assumes a certain density of sub band gap states which are populated below the quasi-Fermi level. Only charges within the conduction band are mobile and these are populated via thermal detrapping of the sub band gap electrons. The detrapping rate increases as the quasi-Fermi level moves towards the conduction band. In this instance the filling of sub band gap states is facilitated by increasing the background light intensity and hence charge density in the device. The effective diffusion coefficients for the $SnO_2$—MgO and $SnO_2$—$TiO_2$—MgO cells are similar. However, the extracted diffusion coefficients for the "bare" $SnO_2$ based device is reduced when comparing at constant background light intensity. It is assumed this is due to the charge density in this device being considerably lower, as reflected by the poor short-circuit currents, and not due to some intrinsic change of properties.

Efficient current collection can occur if the electron diffusion length is longer than the film thickness. Statistically, it should be about three times the film thickness to enable close to complete current collection. To estimate the diffusion length ($L_D$) we need to know both the electron lifetime ($\tau_e$) and diffusion coefficient ($D_e$) estimated under identical conditions, with $L_D=\sqrt{D_e \times \tau_e}$. In FIGS. 5a and 5b we have estimated the electron lifetime under open-circuit conditions and the diffusion coefficient under short-circuit conditions. We can also estimate the electron lifetime under short-circuit conditions via a "constant current transient photo voltage technique": a constant current is held through the device with a sourcemeter (galvinostatic mode) equivalent to the short-circuit current generated by the background white light illumination. The voltage perturbation is then measuring across the device following a small red light perturbation pulse. Here, similarly to at "zero current" (open-circuit), the voltage perturbation decay is proportional to the charge lifetime. The diffusion length estimated by this means is shown in FIG. 5c for the different device compositions. The cell thickness is approximately 1.6 µm. The diffusion length for the "bare" SnO$_2$ based cell is around 0.5 µm over the range of light intensities, consistent with the limited current collection in this device. The SnO$_2$—MgO based cell has a diffusion length of around 1.6 µm. The trend is certainly consistent with significantly enhanced current collection following the MgO surface coating. However, for a solar cell with a diffusion length equal to the film thickness we would expect to only obtain approximately 85% current collection efficiency. We do note however that the diffusion length we have calculated is an estimation, and there could certainly be a factor of two difference between this and the actual diffusion length. The SnO$_2$—TiO$_2$—MgO based cell has significant further enhancements in the diffusion lengths, with the maximum diffusion length for the SnO$_2$—TiO$_2$—MgO based device being near 6 µm. This is close to that reported for the most efficient TiO$_2$ based state-of-the-art devices, which are reported in the range of 6 to 20 µm.

The most telling observation here is that although the diffusion length is significantly enhanced for the cells incorporating TiO$_2$—MgO shells, the current collection efficiency is reduced in comparison to the SnO$_2$—MgO based devices. This is very strong evidence, suggesting that current collection at short-circuit is not limiting the short-circuit photocurrent of titania based solid-state DSCs, but charge generation and separation is a major obstacle in the way of further efficiency enhancements for the titania based cells. On this note we have demonstrated that this issue is overcome by replacing TiO$_2$ with SnO$_2$.

For the SnO$_2$—MgO based cell, the diffusion length is close to the film thickness. In standard TiO$_2$ based cells, as the electrical bias is increased in the device towards open-circuit the diffusion length drops considerably, becoming comparable with the film thickness near open-circuit. The same trend with increasing electrical bias appears to occur even more strongly for the SnO$_2$—MgO system. In FIG. 5d the diffusion length versus bias is presented for SnO$_2$—MgO, and SnO$_2$—MgO—TiO$_2$ based cells. The diffusion length drops considerably faster for the SnO$_2$ based cell. Hence, the inferior fill factor and to a certain extent inferior open-circuit voltage of this new photovoltaic composite is likely to be a consequence of reduced current collection efficiency under working conditions due to recombination of photogenerated electrons and holes.

The invention claimed is:

1. A solid-state p-n heterojunction comprising an organic p-type material in contact with an n-type material wherein said n-type material comprises mesoporous SnO$_2$ coated with at least two materials and wherein the outermost coating closest to the p-type material is a surface-coating of a surface coating material having a conduction band edge closer to vacuum level and/or a higher band-gap than SnO$_2$.

2. A solid-state p-n heterojunction as claimed in claim 1 wherein the heterojunction is sensitised to light by additionally comprising at least one sensitizer.

3. A solid-state p-n heterojunction as claimed in claim 2 wherein said sensitizer is an organic dye, a metal-complexed dye, a quantum-dot photosensitizer or a mixture thereof.

4. A solid state p-n heterojunction as claimed in claim 2 wherein said sensitizer is at least one selected from the group consisting of a ruthenium complex dye, a metal-phthalocyanine complex dye, a metal-porphryin complex dye, a squarine dye, a thiophene based dye, a fluorene based dye, a polymer dye, a quantum dot sensitizer, and mixtures thereof.

5. A solid state p-n heterojunction as claimed in claim 1 wherein said p-type material is an organic hole-transporter.

6. A solid state p-n heterojunction as claimed in claim 5 wherein said organic hole-transporter is at least one optionally oligomerized, polymerized and/or cross-linked compound of formula (tI), (tII), (tIII), (tIV) and/or (tV) below,

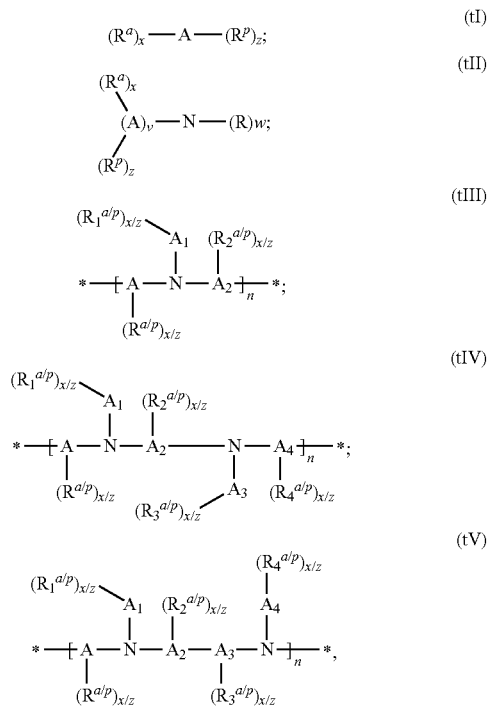

wherein:
N, if present, is a nitrogen atom;
n, if applicable, is in the range of 1-20;
A is a mono-, or polycyclic system comprising at least one pair of a conjugated double bond (—C=C—C=C—), the cyclic system optionally comprising one or more heteroatoms, and optionally being substituted, whereby in a compound comprising more than one structures A, each A may be selected independently from another A present in the same structure (tI-tV);
each of A$_1$-A$_4$, if present, is an A independently selected from the A as defined above;
v in (tII) recites the number of cyclic systems A linked by a single bond to the nitrogen atom and is 1, 2 or 3;
(R)w is an optional residue selected from a hydrocarbon residue comprising from 1 to 30 carbon atoms, optionally substituted and optionally comprising 1 or more heteroatoms, with w being 0, 1 or 2 provided that v+w does not exceed 3, and, if w=2, the respective Rw$_1$ or Rw$_2$ being the same or different;
R$^a$ represents a residue capable, optionally together with other R$^a$ present on the same structure (tI-tV), of decreasing the melting point of an organic compound and is selected from a linear, branched or cyclic alkyl, or a residue comprising one or more oxygen atoms, wherein the alkyl and/or the oxygen comprising residue is optionally halogenated;
x is the number of independently selected residues R$^a$ linked to an A and is selected from 0 to a maximum possible number of substituents of a respective A, independently from the number x of other residues R$^a$ linked to another A optionally present;

with the proviso that per structure (tI-tV) there is at least one $R^a$ being an oxygen containing residue as defined above; and, if several $R^a$ are present on the same structure (tI-tV), they are the same or different; and wherein two or more $R^a$ may form an oxygen-containing ring;

$R^p$ represents an optional residue enabling a polymerisation reaction with compounds comprising structure (tI-tV) used as monomers, and/or a cross-linking reaction between different compounds comprising structures (tI-tV);

z is the number of residues $R^p$ linked to an A, and is 0, 1, and/or 2, independently from the number z of other residues $R^p$ linked to another A optionally present;

$R^p$ may be linked to an N-atom, to an A, and/or to a substituent $R^p$ of other structures according to (tI-tV), resulting in repeated, cross-linked and/or polymerised moieties of (tI-tV);

$(R^{a/p})_{x/z}$ and $(R_{1-4}{}^{a/P})_{x/z}$, if present, represent independently selected residues $R^a$ and $R^p$ as defined above.

7. A solid state p-n heterojunction as claimed in claim 5 wherein said organic hole-transporter is a compound of formula tXVII below:

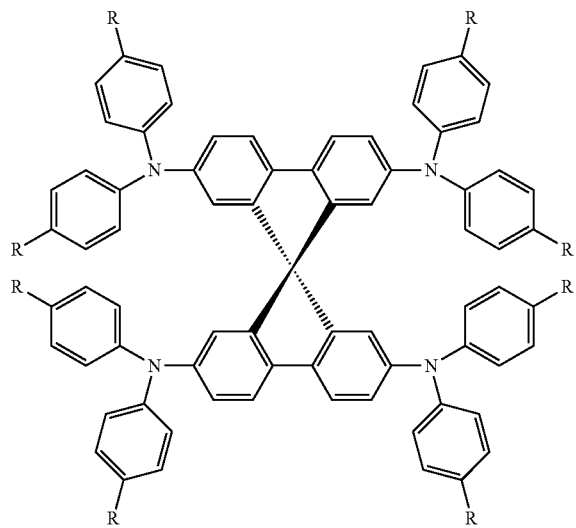

Formula tXVII wherein R is C1-C6 alkyl or C1-C6 O-alkyl.

8. A solid state p-n heterojunction as claimed in claim 1 wherein said n-type material is porous.

9. A solid-state p-n heterojunction as claimed in claim 1 wherein said n-type material is substantially planar and said heterojunction forms a substantially planar junction.

10. A solid state p-n heterojunction as claimed in claim 1 wherein said surface coating material has a band gap of 4.6 to 8 eV, and/or a conduction band edge of −4.8 eV or less negative relative to vacuum level.

11. A solid state p-n heterojunction as claimed in claim 1 wherein said surface coating material comprises at least one single metal oxide, compound metal oxide, doped metal oxide, carbonate, sulphide, selenide, teluride, nitrides and/or multicompound semiconductor.

12. A solid state p-n heterojunction as claimed in claim 1 wherein said $SnO_2$ is additionally coated with at least one intermediate coating between the "core" $SnO_2$ material and the surface coating of the surface coating material, wherein the intermediate coating comprises a material with a higher band-gap and/or a conduction band closer to the vacuum level than $SnO_2$ and/or a material with a band gap similar to that of $SnO_2$.

13. A solid state p-n heterojunction as claimed in claim 1 wherein said $SnO_2$ is additionally coated with at least one intermediate coating between the "core" $SnO_2$ material and the surface coating of the surface coating material, wherein the intermediate coating comprises a material with a lower band-gap and/or a conduction band further from the vacuum level than $SnO_2$ and/or a material with a band gap similar to that of $SnO_2$.

14. A solid state p-n heterojunction as claimed in claim 1 having at least one intermediate coating of a material with a band gap similar to that of $SnO_2$.

15. A solid state p-n heterojunction as claimed in claim 1 having at least one intermediate coating of a material selected from the group consisting of a single metal oxide, compound metal oxide, doped metal oxide, carbonate, sulphide, selenide, teluride, nitrides, multicompound semiconductor, and combinations thereof.

16. A solid state p-n heterojunction as claimed in claim 1 wherein said $SnO_2$ is essentially pure $SnO_2$, or is doped throughout with at least one dopant material of greater valency than Sn (>4, n-type doping), and/or is doped with at least one dopant material of lower valency than Sn (<4, p-type doping).

17. A solid state p-n heterojunction as claimed in claim 16 wherein said $SnO_2$ is doped with at least one element selected from the group consisting of F, Sb, N, Ge, Si, C, and combinations thereof.

18. An optoelectronic device comprising at least one solid state p-n heterojunction as claimed in claim 1.

19. An optoelectronic device as claimed in claim 18 wherein said device is a solar cell or photo-detector.

20. A method of using mesoporous $SnO_2$ having at least two surface coatings in which the outermost coating is a material having a conduction band closer to vacuum level and/or a higher band gap than $SnO_2$ as an n-type material in a solid state p-n heterojunction, wherein said heterojunction is an organic solid state p-n heterojunction as claimed in claim 1.

21. A method for the manufacture of a solid-state p-n heterojunction as claimed in claim 1, said method comprising:
i) forming a layer of an n-type semiconductor material comprising mesoporous $SnO_2$ having least two surface coatings in which the outermost coating is a material having a conduction band closer to vacuum level and/or a higher band gap than $SnO_2$,
ii) optionally coating said n-type material with a light sensitizing material, and
iii) contacting said n-type material with a solid state p-type semiconductor material.

22. A method as claimed in claim 21 wherein said layer of an n-type semiconductor material comprising mesoporous $SnO_2$ having least two surface coatings in which the outermost coating is a material having a conduction band closer to vacuum level and/or a higher band gap than $SnO_2$ is formed by sintering of a layer of fine $SnO_2$ particles followed by surface coating of the sintered layer with said surface coating material.

23. A method as claimed in claim 21 wherein said porous layer of an n-type semiconductor material comprising mesoporous $SnO_2$ having least two surface coatings in which the outermost coating is a material having a conduction band closer to vacuum level and/or a higher band gap than $SnO_2$ is formed by surface coating fine $SnO_2$ particles with said surface coating materials, followed by sintering of a layer of the coated $SnO_2$ particles.

24. A method as claimed in claim 21 wherein said layer is a compact n-type semiconductor material comprising $SnO_2$ coated with said surface coating materials.

25. A solid-state p-n heterojunction formed or formable by the method of claim 21.

26. An optoelectronic device comprising at least one solid-state p-n heterojunction formed or formable by the method of claim 21.

27. The solid-state p-n heterojunction as claimed in claim 2 wherein the sensitizer is at the junction of the p-type and n-type materials.

28. The solid-state p-n heterojunction as claimed in claim 5 wherein the organic hole transporter is substantially amorphous.

29. The solid-state p-n heterojunction as claimed in claim 8 wherein said n-type material has a surface area of 1-400 $m^2g^{-1}$.

30. The solid-state p-n heterojunction as claimed in claim 8 wherein said n-type material is in the form of an electrically continuous layer.

31. The solid-state p-n heterojunction as claimed in claim 30 wherein said electrically continuous layer has a thickness 0.5 to 20 μm.

32. The solid-state p-n heterojunction as claimed in claim 11 wherein said surface coating material is MgO.

33. The solid-state p-n heterojunction as claimed in claim 14 wherein the band gap of the intermediate coating of the material is 3±1.5 eV.

34. The optoelectronic device as claimed in claim 26 wherein the optoelectronic device is photovoltaic cell or light sensing device.

* * * * *